(12) United States Patent
Radtke et al.

(10) Patent No.: US 7,795,877 B2
(45) Date of Patent: Sep. 14, 2010

(54) POWER LINE COMMUNICATION AND POWER DISTRIBUTION PARAMETER MEASUREMENT SYSTEM AND METHOD

(75) Inventors: William O. Radtke, Ellicott City, MD (US); Andrew T. Rayno, Poolesville, MD (US)

(73) Assignee: Current Technologies, LLC, Germantown, MD (US)

( * ) Notice: Subject to any disclaimer, the term of this patent is extended or adjusted under 35 U.S.C. 154(b) by 420 days.

(21) Appl. No.: 11/555,740

(22) Filed: Nov. 2, 2006

(65) Prior Publication Data

US 2008/0122642 A1    May 29, 2008

(51) Int. Cl.
*G01R 31/28* (2006.01)
(52) U.S. Cl. .................. 324/530; 336/174; 340/310.17; 340/538; 370/236; 702/188
(58) Field of Classification Search .................. 324/530
See application file for complete search history.

(56) References Cited

U.S. PATENT DOCUMENTS

| | | | |
|---|---|---|---|
| 4,550,360 A * | 10/1985 | Dougherty | ................ 361/93.2 |
| 4,635,055 A | 1/1987 | Fernandes et al. | |
| 4,758,962 A | 7/1988 | Fernandes | |
| 5,006,846 A | 4/1991 | Granville et al. | |
| 5,369,356 A | 11/1994 | Kinney et al. | |
| 5,414,400 A * | 5/1995 | Gris et al. | ................ 336/174 |
| 5,498,956 A | 3/1996 | Kinney et al. | |
| 5,760,492 A | 6/1998 | Kanoi et al. | |
| 5,777,545 A | 7/1998 | Patel | |
| 6,151,330 A | 11/2000 | Liberman | |
| 6,313,623 B1 | 11/2001 | Kojovic et al. | |
| 6,828,770 B1 | 12/2004 | McCauley et al. | |
| 6,917,888 B2 | 7/2005 | Logvinov et al. | |
| 7,069,117 B2 | 6/2006 | Wilson et al. | |
| 7,089,125 B2 | 8/2006 | Sonderegger | |
| 7,105,952 B2 | 9/2006 | Divan et al. | |
| 7,132,819 B1 | 11/2006 | Cope et al. | |
| 7,224,272 B2 * | 5/2007 | White et al. | ................ 340/538 |
| 7,424,400 B2 * | 9/2008 | McCormack et al. | ....... 702/188 |

(Continued)

OTHER PUBLICATIONS

"International Search Report", International Search Report Dated May 7, 2008, PCT/US07/082759.

(Continued)

*Primary Examiner*—Timothy J Dole
*Assistant Examiner*—Benjamin M Baldridge
(74) *Attorney, Agent, or Firm*—Mel Barnes; Capital Legal Group, LLC

(57) ABSTRACT

A power line communication device is provided that in one embodiment includes a parameter sensor device configured to measure a parameter of a power line, a modem configured to transmit parameter data over a power line, and a controller communicatively coupled to the current sensor device and modem. The parameter sensor device may include a current sensor device that includes a Rogowski coil. For measuring the current or other parameter of a higher voltage power line conductor, the parameter sensor device may be configured to provide data to the controller via a non-conductive communication link, such as via a wireless, fiber optic, or radio frequency transponder link. In addition, the parameter sensor device may include an isolated power source and receive power via a fiber optic conductor or inductively from the power line.

57 Claims, 7 Drawing Sheets

U.S. PATENT DOCUMENTS

| | | | |
|---|---|---|---|
| 7,436,321 B2* | 10/2008 | White et al. | 340/870.02 |
| 7,558,206 B2* | 7/2009 | Berkman et al. | 370/236 |
| 7,626,489 B2* | 12/2009 | Berkman et al. | 340/310.11 |
| 2001/0052843 A1 | 12/2001 | Wiesman et al. | |
| 2002/0000802 A1* | 1/2002 | Panto et al. | 324/117 R |
| 2003/0067725 A1 | 4/2003 | Horvath et al. | |
| 2003/0105608 A1 | 6/2003 | Hart | |
| 2003/0137388 A1 | 7/2003 | Meier et al. | |
| 2003/0169155 A1* | 9/2003 | Mollenkopf et al. | 340/310.01 |
| 2004/0021455 A1* | 2/2004 | Staats | 324/126 |
| 2004/0160227 A1 | 8/2004 | Piesinger | |
| 2004/0183522 A1 | 9/2004 | Gunn et al. | |
| 2004/0212512 A1 | 10/2004 | Stewart | |
| 2005/0040809 A1 | 2/2005 | Uber, III et al. | |
| 2005/0073200 A1* | 4/2005 | Divan et al. | 307/44 |
| 2005/0083206 A1 | 4/2005 | Couch et al. | |
| 2005/0141682 A1 | 6/2005 | Wells | |
| 2005/0168326 A1* | 8/2005 | White et al. | 340/310.01 |
| 2005/0169056 A1* | 8/2005 | Berkman et al. | 365/185.22 |
| 2006/0007016 A1 | 1/2006 | Borkowski et al. | |
| 2006/0036795 A1 | 2/2006 | Leach | |
| 2006/0044117 A1 | 3/2006 | Farkas et al. | |
| 2006/0060007 A1 | 3/2006 | Mekhanoshin et al. | |
| 2006/0071776 A1* | 4/2006 | White et al. | 340/538 |
| 2006/0076946 A1 | 4/2006 | Shvach et al. | |
| 2006/0084419 A1 | 4/2006 | Rocamora et al. | |
| 2006/0087777 A1 | 4/2006 | Bruno | |
| 2006/0106554 A1 | 5/2006 | Borkowski et al. | |
| 2006/0119344 A1* | 6/2006 | Benke et al. | 324/126 |
| 2006/0187074 A1 | 8/2006 | O'Sullivan et al. | |
| 2006/0192672 A1* | 8/2006 | Gidge et al. | 340/538.11 |
| 2006/0195229 A1 | 8/2006 | Bell et al. | |
| 2006/0217058 A1 | 9/2006 | Staszesky et al. | |
| 2006/0241880 A1 | 10/2006 | Forth et al. | |
| 2006/0271313 A1 | 11/2006 | Mollenlopf | |
| 2006/0284647 A1 | 12/2006 | Gunn et al. | |
| 2007/0002771 A1* | 1/2007 | Berkman et al. | 370/257 |
| 2007/0014313 A1 | 1/2007 | Bickel et al. | |
| 2007/0024264 A1 | 2/2007 | Lestician | |
| 2007/0090811 A1 | 4/2007 | Labuschagne | |
| 2007/0136010 A1 | 6/2007 | Gunn et al. | |
| 2007/0179721 A1 | 8/2007 | Yaney | |
| 2007/0179726 A1 | 8/2007 | Bickel | |
| 2007/0185665 A1 | 8/2007 | Roytelman | |
| 2007/0203658 A1 | 8/2007 | Patel | |
| 2007/0213879 A1 | 9/2007 | Iwamura | |
| 2007/0219755 A1 | 9/2007 | Williams et al. | |
| 2007/0223381 A1* | 9/2007 | Radtke | 370/236 |
| 2007/0229295 A1 | 10/2007 | Curt et al. | |
| 2007/0285079 A1 | 12/2007 | Nasle | |
| 2008/0007416 A1 | 1/2008 | Cern | |
| 2008/0048668 A1 | 2/2008 | Mashikian | |
| 2008/0065342 A1 | 3/2008 | Zalitzky et al. | |
| 2008/0077336 A1 | 3/2008 | Fernandes | |
| 2008/0097706 A1* | 4/2008 | McCormack et al. | 702/59 |
| 2008/0122642 A1 | 5/2008 | Radtke et al. | |
| 2009/0189594 A1 | 7/2009 | Cern | |
| 2009/0228154 A1 | 9/2009 | Trias | |

OTHER PUBLICATIONS

"Written Opinion", Written Opinion Dated May 7, 2008, PCT/US07/082759.

"Centralized Commercial Building Applications with the Lonworks® PLT-21 Power Line Transceiver", *Lonworks Engineering Bulletin, Echelon*, (Apr. 1997), 1-22.

* cited by examiner

POWER LINE COMMUNICATION AND POWER DISTRIBUTION PARAMETER MEASUREMENT SYSTEM AND METHOD

FIELD OF THE INVENTION

The present invention generally relates to methods and apparatus for communicating data over a power line, and more particularly to a power line communication system including sensor devices for measuring power distribution parameters.

BACKGROUND OF THE INVENTION

Power distribution parameters such as power line current, power line voltage and network load distribution are useful for monitoring the efficiency of a power line distribution system. However, such information has not been available in a satisfactory manner to optimize network management. Consider power line current. The current flowing over a given power line may vary depending on the power needs of customers and the conditions of the power line network. Access to real time measurements of the current flowing through power lines at various portions of a network may allow the utility to more efficiently allocate distribution resources. However, current measurements typically have only been available at transfer substations (i.e., a location where the high voltage power lines couple to medium voltage power lines for regional power distribution) and, in some instances, at the customer's power meter. Accordingly, there is a need for measuring power line current and other parameters at many locations. Further, in order to allow the utility to dynamically modify its network in response network conditions, there is a need to communicate real time power line current measurements and/or other power distribution parameter data from many locations to a processing center of the utility.

One challenge for providing such data includes difficulty in obtaining accurate power line current measurements. Still another challenge involves isolating the data gathering and communication devices from the medium voltage power line signals. Accordingly, there is a need for a system for gathering and communicating power distribution parameters, such as power line current, power line voltage, power line power factor data, harmonic content, transient load conditions (cold-load pick-up), fault detection, and other such parameters.

SUMMARY OF THE INVENTION

The present invention provides a power line communication device that in one embodiment includes a parameter sensor device configured to measure a parameter of a power line, a modem configured to transmit parameter data over a power line, and a controller communicatively coupled to the current sensor device and modem. The parameter sensor device may include a current sensor device that includes a Rogowski coil. For measuring the current or other parameter of a higher voltage power line conductor, the parameter sensor device may be configured to provide data to the controller via a non-conductive communication link, such as via a wireless, fiber optic, or radio frequency transponder link. In addition, the parameter sensor device may include an isolated power source and receive power via a fiber optic conductor, inductively from the power line, or some other form of energy harvesting.

The invention will be better understood by reference to the following detailed description taken in conjunction with the accompanying drawings.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION OF ILLUSTRATIVE EMBODIMENTS

Figure 1:
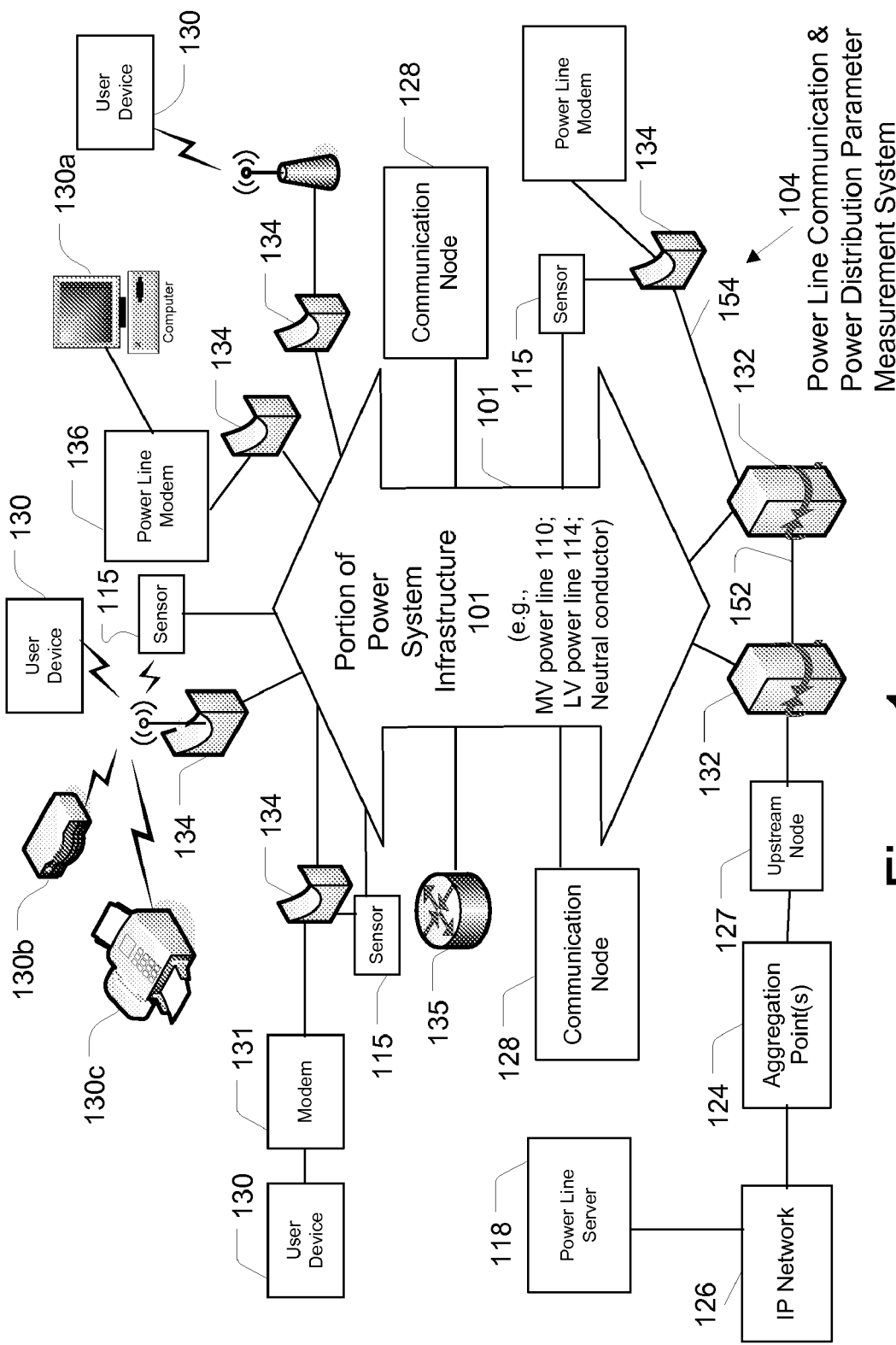
FIG. 1 is a block diagram of an example power line communication and power distribution parameter measurement system.

In the following description, for purposes of explanation and not limitation, specific details are set forth, such as particular networks, communication systems, computers, terminals, devices, components, techniques, data and network protocols, power line communication systems (PLCSs), software products and systems, enterprise applications, operating systems, development interfaces, hardware, etc. in order to provide a thorough understanding of the present invention.

However, it will be apparent to one skilled in the art that the present invention may be practiced in other embodiments that depart from these specific details. Detailed descriptions of well-known networks, communication systems, computers, terminals, devices, PLCSs, components, techniques, data and network protocols, software products and systems, operating systems, development interfaces, and hardware are omitted so as not to obscure the description of the present invention.

Communication and Measurement System

The power line communication and power distribution parameter measurement system of the present invention may gather power distribution parameters from multiple points along a power distribution network and transmit the gathered data to a utility or other processing center. For example, sensor devices may be positioned along overhead and underground medium voltage power lines, and along network (external or internal) low voltage power lines. The measured power line parameter data may be used in many ways. For example, the power line utility may monitor power line current at many locations to improve operations and maintenance, and to assist in network planning. Load balancing may be performed such as by re-configuring switches to more efficiently distribute loads. Infrastructure build-outs can be planned based on usage patterns in specific portions of a network. Capacitor banks may be installed to optimize network performance.

The power line communication and power line communication and distribution parameter measurement system also may provide user services (i.e., communicate user data), such as high speed broadband internet access, mobile telephone communications, broadband communications, streaming video and audio services, and other communication services to homes, buildings and other structures, and to each room, office, apartment, or other unit or sub-unit of multi-unit structures. Communication services also may be provided to mobile and stationary devices in outdoor areas such as customer premises yards, parks, stadiums, and also to public and semi-public indoor areas such as subway trains, subway stations, train stations, airports, restaurants, public and private automobiles, bodies of water (e.g., rivers, bays, inlets, etc.), building lobbies, elevators, etc.

In some embodiments, a power line parameter sensor device, which includes a sensor for measuring a parameter (i.e., value or characteristic), is installed at each communication node to measure power line parameters of various regions, neighborhoods and structures. The power parameter sensor device may measure (meant to include measure or detect) one or more electrical distribution parameters, which may include, for example purposes only, power usage, power line voltage, power line current, detection of a power outage, detection of water in a pad mount, detection of an open pad mount, detection of a street light failure, power delivered to a transformer, power factor (e.g., the phase angle between the voltage and current of a power line), power delivered to a downstream branch, data of the harmonic components of a power signal, load transients, and/or load distribution. One skilled in the art will appreciate that other types of utility and parameter data also may be measured or detected. In an example embodiment, the sensor device may comprise a power line current sensor that is formed of a Rogowski coil and such sensor device may be installed throughout a network (on both MV and LV power lines). The Rogowski coil is an electrical device for measuring alternating current (AC) or high speed current pulses. An exemplary embodiment includes a first and second helical coils of wire (loops) electrically connected in series with each other. The first loop is wound with a substantially constant winding density in a first direction around a core that has a substantially constant cross section. The second loop is wound with a substantially constant winding density in a second direction around a core that has a substantially constant cross section. A conductor (e.g., a power line) whose current is to be measured traverses through the loops. A voltage may be induced in the coil based on the rate of change of the current running through the power line. Rogowski coils may have other configurations as well.

One advantage of a Rogowski coil is that it may be open-ended and flexible, allowing it to be wrapped around an energized conductor. Also, a Rogowski coil may include an air core (or other dielectric core) rather than an iron core, which gives the coil a low inductance and an ability to respond to fast-changing currents. Further, the Rogowski coil typically is highly linear, even when subjected to large currents, such as those of low voltage and medium voltage power lines. By forming the Rogowski coil with equally spaced windings, effects of electromagnetic interference may be substantially avoided. On method of providing equal spaced windings is to use printed circuit boards to manufacture the coil. Some examples of a Rogowski coil are described in U.S. Pat. No. 6,313,623 issued on Nov. 6, 2001 for "High Precision Rogowski Coil," which is incorporated herein by reference in its entirety.

FIG. 1 shows components of a power line communication system that may be used to also provide a power distribution parameter measurement system. The system 104 includes a plurality of communication nodes 128 which form communication links using power lines 110, 114 and other communication media. Various user devices 130 and power line communication devices may transmit and receive data over the links to communicate via an IP network 126 (e.g., the Internet). Thus, the communicated data may include measurement data of power distribution parameters, control data and user data. One type of communication node 128 may be a backhaul node 132. Another type of communication node 128 may be an access node 134. Another type of communication node 128 may be a repeater node 135. A given node 128 may serve as a backhaul node 132, access node 134, and/or repeater node 135.

A communication link is formed between two communication nodes 128 over a communication medium. Some links may be formed over MV power lines 110. Some links may be formed over LV power lines 114. Other links may be gigabit-Ethernet links 152, 154 formed, for example, using a fiber optic cable. Thus, some links may be formed using a portion 101 of the power system infrastructure, while other links may be formed over another communication media, (e.g., a coaxial cable, a T-1 line, a fiber optic cable, wirelessly (e.g., IEEE 802.11 a/b/g, 802.16, 1 G, 2G, 3G, or satellite such as WildBlue®)). The links formed by wired or wireless media may occur at any point along a communication path between a backhaul node 132 and a user device 130.

Each communication node 128 may be formed by one or more communication devices. Communication nodes which communicate over a power line medium include a power line communication device. Exemplary power line communication devices include a backhaul device 138 (see FIG. 6), an access device 139 (see FIG. 8), and a repeater 135. Communication nodes which communicate wirelessly may include a mobile telephone cell site or a wireless access point having at least a wireless transceiver. Communication nodes which communicate over a coaxial cable may include a cable modem. Communication nodes which communicate over a twisted pair wire may include a DSL modem or other modem. A given communication node typically will communicate in two directions (either full duplex or half duplex), which may be over the same or different types of communication media. Accordingly, a communication node 128 may include one, two or more communication devices.

A power line parameter sensor device 115 may be located in the vicinity of, and communicatively coupled to, a power line communication device 134, 135, 132. The power line parameter sensor device 115 measures (hereinafter to include measure or detect) a power line parameter of a power line 110, 114, such as current, voltage, power usage data, detection of a power outage, detection of water in a pad mount transformer enclosure, detection of an open pad mount transformer enclosure, detection of a street light failure, power delivered to a transformer data (i.e., wherein the sensor device is coupled the conductor that connects the distribution transformer to the MV power line), power factor data (e.g., the phase angle between the voltage and current of a power line), power delivered to a downstream branch data, data of the harmonic components of a power signal, load transients data, and/or load distribution data. One skilled in the art will appreciate that other types of utility parameter data also may be measured. The measured parameter may be sampled by the power line communication device and communicated to a power line server 118, or other power line distribution management system and/or power line communication management system.

A backhaul node 132 may serve as an interface between a power line medium (e.g., an MV power line 110) of the system 104 and an upstream node 127, which may be, for example, connected to an aggregation point 124 that may provide a connection to an IP network 126. The system 104 typically includes one or more backhaul nodes 132. Upstream communications from user premises and control and monitoring communications from power line communication devices may be communicated to an access node 134, to a backhaul node 132, and then transmitted to an aggregation point 124 which is communicatively coupled to the IP network 126. Communications may traverse the IP network to a destination, such as a web server, power line server 118, or an end user device. The backhaul node 132 may be coupled to the aggregation point 124 directly or indirectly (i.e., via one or more intermediate nodes 127). The backhaul node 132 may communicate with its upstream device via any of several alternative communication media, such as a fiber optic cable (digital or analog (e.g., Wave Division Multiplexed)), coaxial cable, WiMAX, IEEE 802.11, twisted pair and/or another wired or wireless media. Downstream communications from the IP network 126 typically are communicated through the aggregation point 124 to the backhaul node 132. The aggregation point 124 typically includes an Internet Protocol (IP) network data packet router and is connected to an IP network backbone, thereby providing access to an IP network 126 (i.e., can be connected to or form part of a point of presence or POP). Any available mechanism may be used to link the aggregation point 124 to the POP or other device (e.g., fiber optic conductors, T-carrier, Synchronous Optical Network (SONET), and wireless techniques).

An access node 134 may transmit data to and receive data from, one or more user devices 130 or other network destinations. Other data, such as power line parameter data (e.g., current measured by a power line current sensor) may be received by an access node's power line communication device 139. The data enters the network 104 along a communication medium coupled to the access node 134. The data is routed through the network 104 to a backhaul node 132. Downstream data is sent through the network 104 to a user device 130. Exemplary user devices 130 include a computer 130a, LAN, a WLAN, router 130b, Voice-over IP endpoint, game system, personal digital assistant (PDA), mobile telephone, digital cable box, security system, alarm system (e.g., fire, smoke, carbon dioxide, security/burglar, etc.), stereo system, television, fax machine 130c, HomePlug residential network, or other user device having a data interface. The system also may be use to communicate utility usage data from a automated gas, water, and/or electric power meter. A user device 130 may include or be coupled to a modem to communicate with a given access node 134. Exemplary modems include a power line modem 136, a wireless modem 131, a cable modem, a DSL modem or other suitable modem or transceiver for communicating with its access node.

A repeater node 135 may receive and re-transmit data (i.e., repeat), for example, to extend the communications range of other communication elements. As a communication traverses the communication network 104, backhaul nodes 132 and access nodes 134 also may serve as repeater nodes 135, (e.g., for other access nodes and other backhaul nodes 132). Repeaters may also be stand-alone devices without additional functionality. Repeaters 135 may be coupled to and repeat data on MV power lines or LV power lines (and, for the latter, be coupled to the internal or external LV power lines).

Each communication node 128 may be formed by one or more communication devices. Communication nodes which communicate over a power line medium include a power line communication device. Exemplary power line communication devices include a backhaul device 138, an access device 139 (also referred to as a power line bridge), and a repeater. These power line communication devices are described below in more detail below. Communication nodes which access a link over a wireless medium may include a wireless access point having at least a wireless transceiver, which may comprise mobile telephone cell site/transceiver (e.g., a micro or pico cell site) or a IEEE 802.11 transceiver (Wifi). Communication nodes which access a link over a coaxial cable may include a cable modem. Communication nodes which access a link over a twisted pair may include a DSL modem. According to an embodiment of a power line communication device, a backhaul device 138 or access device 139 or repeater may establish links over MV power lines 110, LV power lines 114, wired media, and wireless media. Accordingly, a given communication node may communicate along two or more directions establishing multiple communication links, which may be formed along the same or different types of communication media.

Figure 10:
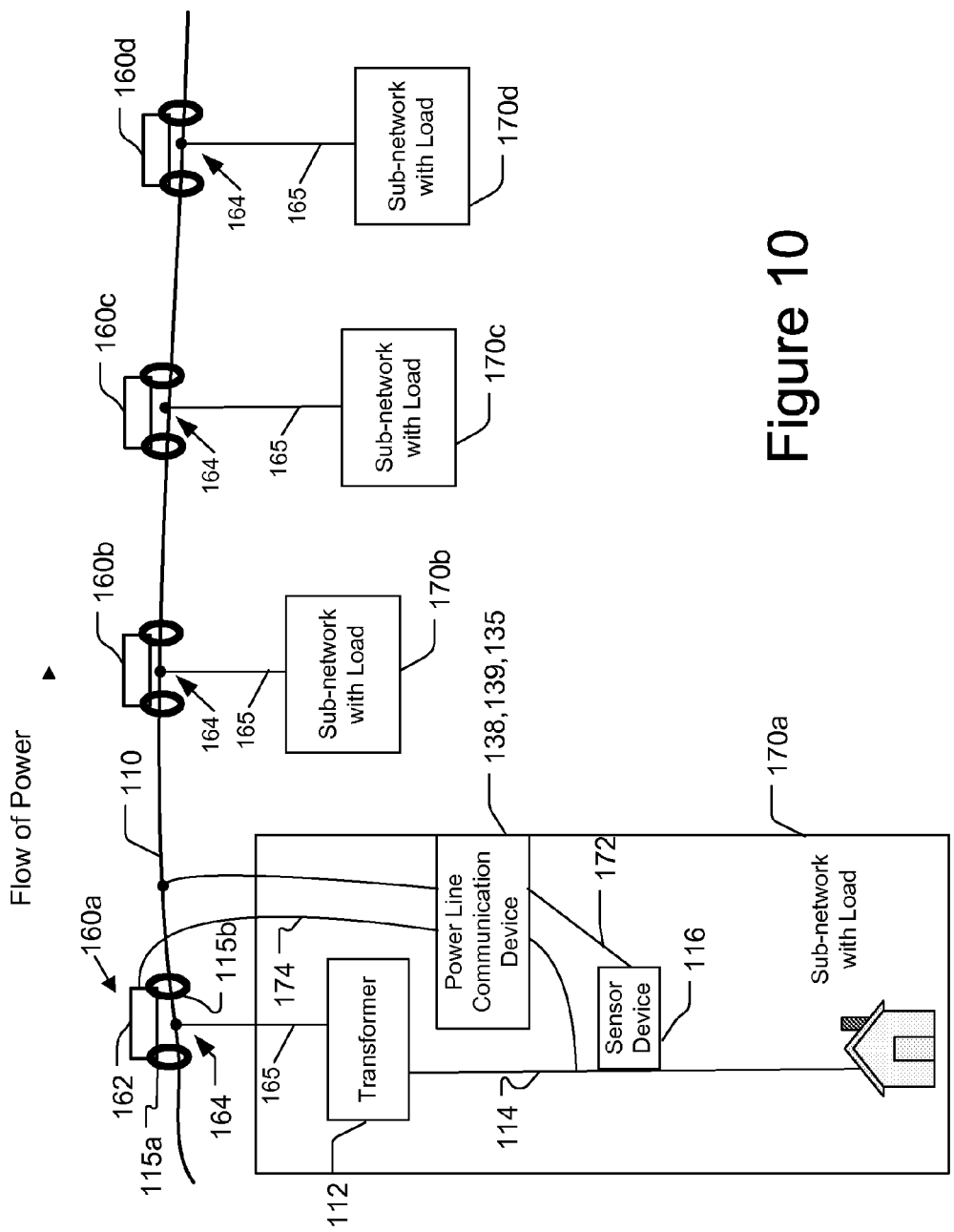
FIG. 10 illustrates a plurality of sensor devices located at various positions for collecting power line distribution parameter data according to an example embodiment of the present invention.

Power Distribution Parameter Sensor Device:

In various embodiments, the power line distribution parameter sensor device 115 may measure or detect a parameter of a power line 110, 114, such as current, voltage, power usage data, detection of a power outage, detection of water in a pad mount transformer enclosure, detection of an open pad mount transformer enclosure, detection of a street light failure, power delivered to a transformer data (e.g., the sensor device may be coupled the conductor 165 that connects the distribution transformer to the MV power line—see FIG. 10), power factor data (e.g., the phase angle between the voltage and current of a power line, which may be determined by processing data from multiple sensors (i.e., current and voltage), power delivered to a downstream branch data, data of the harmonic components of a power signal, load transients data, load distribution data, and/or other characteristics. One skilled in the art will appreciate that other types of parameter data also may be gathered. In addition, one sensor device 115 may be configured to provide data of more than one parameter. For example, a sensor device 115 may be configured to provide data of the voltage and current carried by the power line (and therefore have multiple sensors). One or more sensor devices 115 may be installed at a given power line 110 and/or 114 and be coupled to a corresponding power line communication device 138, 139, 135. For example, a power line current sensor device may be installed at power lines 110 and 114 alone or with another power line parameter sensor device (e.g., a power line voltage sensor device). Such a configuration may be used to determine the current and power into and out of a transformer. In addition, the data provided by the sensor device 115 may be used to determine additional parameters (either by the sensor device, the power line communication device, or a remote computer). For example, a sensor device 115 may be configured to measure the instantaneous voltage and current (e.g., over brief time period). The measurement data may be provided to the power line communication device 138, 139, 135 for processing. With adequate voltage and current sampling, the device 138, 138, or 135 may compute the power factor of the power line (through means well known in the art). Thus, other power line parameters may be measured using an appropriate sensor device coupled to a power line 110, 114 in the vicinity of a power line communication device 138, 139, 135 in place of, or in addition to, the power line current sensor device.

Figure 2:
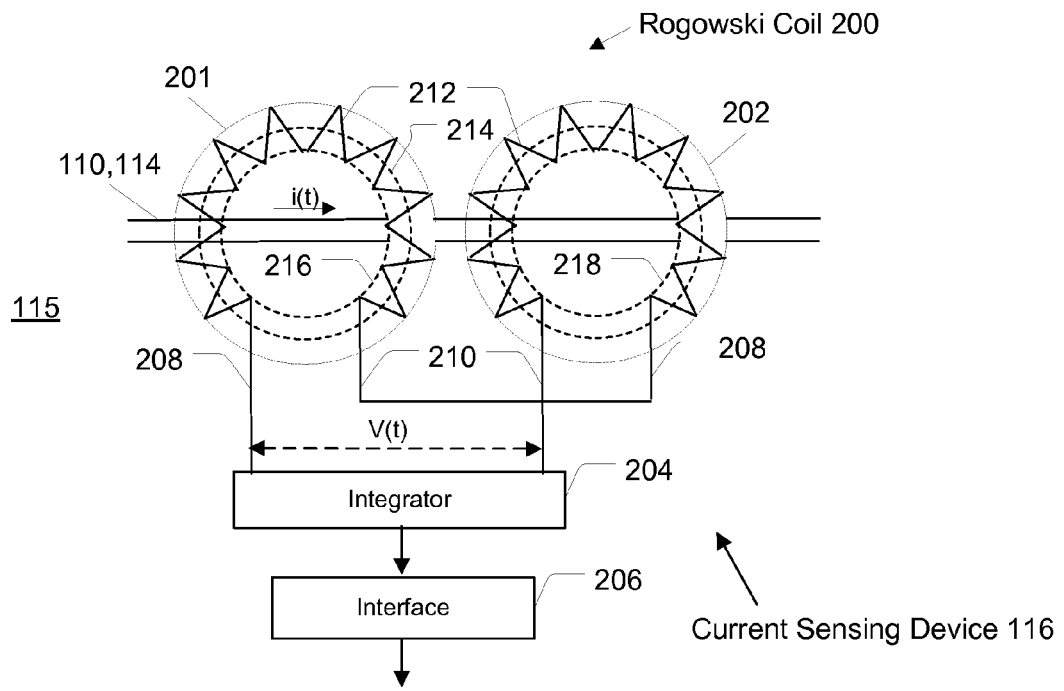
FIG. 2 is a block diagram and partial schematic of an example embodiment of a power line current sensor device.

FIG. 2 shows one example embodiment of a power line parameter sensor device 115, which comprises a power line current sensor device 116 including a Rogowski coil 200 having two loops 201, 202, an integrator 204 and an interface 206. Each loop 201, 202 has a first end 208 and a second end 210. By shaping the loops 201, 202 to bring the two ends 208, 210 toward each other, while leaving space between the ends 208, 210, the Rogowski coil 200 may be readily installed at a power line 110, 114. The coil 200 may have a generally circular shape with an open arc between the ends 208, 210 (to be slipped around the power line) or may be substantially a full closed circle (and formed in two pieces that are hinged together to clamp over the power line). One of ordinary skill in the art will appreciate that other shapes may be implemented. In this example embodiment, to install the current sensor device 116, the two pieces of the loops 201, 202 are clamped around the power line 110, 114 (which may require pulling back the power line neutral conductor for underground power lines). A power line 110, 114 passes through the circular shape as shown. An advantage of these configurations is that the power line 110, 114 may not need to be disconnected (in many instances) to install the current sensor device 116.

The coil 200 of the Rogowski coil may include a first winding 201 wound in a first direction, a second winding 202 wound in a second direction, and wherein said first winding 201 and said second winding 202 each include traces on a printed circuit board. In some embodiments the windings 201, 202 are traced on one or more printed circuit boards (PCBs) 216, 218, and then the printed circuit boards (if more than one) are coupled together to form a monolithic PCB assembly (i.e., one structure). In another embodiment, the two windings of the coil are traced together and interwoven with each other on the PCB (a multi-layer printed circuit board) and therefore may be referred to as being "coupled" together. Because the windings are traced within each other (that is, the loops are interwoven), the loops are not identical in form. In another embodiment, the windings may be traced separately on separate PCBs and have identical geometries on separate PCBs, and be positioned along the power line 110, 114 in close proximity.

As alternating current flows through the power line 110, 114, a magnetic field is generated inducing an electrical field (i.e. voltage) within each winding 201, 202 of the Rogowski coil 200. However, other sources of electromagnetic interference also may induce current flow in the windings 201, 202. By including a left-hand winding 201 and a right-hand winding 202 (i.e., windings in substantially opposite directions) with equally spaced windings, the effects from external sources are largely cancelled out. In particular, external fields from sources outside the Rogowski coil 200, such as other power lines or power line communication and distribution equipment, generate equal but opposite electrical flow in the windings 201, 202. The Rogowski coil 200 provides an instantaneous voltage measurement that is related to the alternating current (AC) flowing through the power line 110, 114.

Each winding 201, 202 of the Rogowski coil 200 comprises an electrical conductor 212 wound around a dielectric core 214 (e.g., PCB). In an example embodiment each loop 201, 202 has windings that are wound with a substantially constant density and a core 214 that has a magnetic permeability that may be equal to the permeability of free space $\mu_o$ (such as, for example, air) or a printed circuit board. In addition, the cross section of the core 214 may be substantially constant.

To obtain an expression for the voltage that is proportional to the current flowing through the power line 110, 114, the coil output voltage, v(t), may be integrated. For example, the integrator 204 may convert the measured voltage v(t) into a value equating to measured current. In example embodiments, the integrator 204 may comprise a resistor-capacitor (RC) integrator, an operational amplifier integrator, a digital filter (integrator), another circuit or a processor. Observing that the voltage v(t), is proportional to the derivative of the current being measured, and that if that current is sinusoidal, the voltage v(t) will also be sinusoidal. Thus, determining the current does not always require integration of the voltage v(t)), in which embodiment the integrator 204 may be omitted.

Referring to FIGS. 2-5, each power line distribution parameter sensor device 115 may include an interface 206 which provides communications with a power line communication device, such as a backhaul device 138, an access device 139, a repeater 135, or other communication device. In various embodiments different interfaces 206 may be implemented. In some embodiments the sensor device 115 may include an analog to digital converter (ADC). In other embodiments, raw analog data is communicated from the sensor device 115 to the power line communication device, which may convert the analog data to digital data (via an ADC) and provide processing. Such processing may include, for example, time stamping, formatting the data, normalizing the data, converting the data (e.g., converting the voltage measured by the ADC to a current value), removing an offset, and other such data processing. The processing also may be performed in the sensor device 115, in the power line communication device. Thus, the sensor device 115 of some embodiments may include a controller, an analog to digital converter (ADC), and a memory coupled to said ADC (perhaps via a controller) and configured to store current data. Alternately, the data may be transmitted to the power line server 118 or another remote computer for processing.

The overhead medium voltage power lines typically are not insulated. Thus, for sensor devices 115 which contact (e.g., are to be clamped around for a Rogowski coil) an overhead medium voltage power line or other high voltage conductor, it may be necessary to isolate the voltage (which may be 5,000-10,000 volts or more) of the power line (to which the power line parameter sensor device 116 is mounted) from the power line communication device 138, 139, 135 and other non-MV power line devices. The communication path of the measured data may comprise a non-conductive communication link that allows the data to be communicated but that does not conduct the high voltages of the MV or other power lines. For power line parameter sensor devices 115 which are clamped around an underground power line, isolation may not be necessary because underground power lines are insulated and, therefore the sensor devices 115 do not come into contact with the medium voltage.

Figure 3:
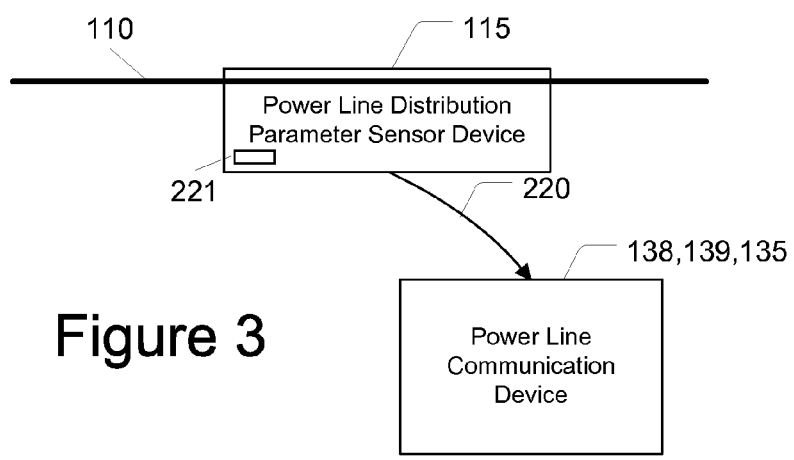
FIG. 3 is a block diagram of a power line parameter sensor device coupled to a power line communication device.
Figure 4:
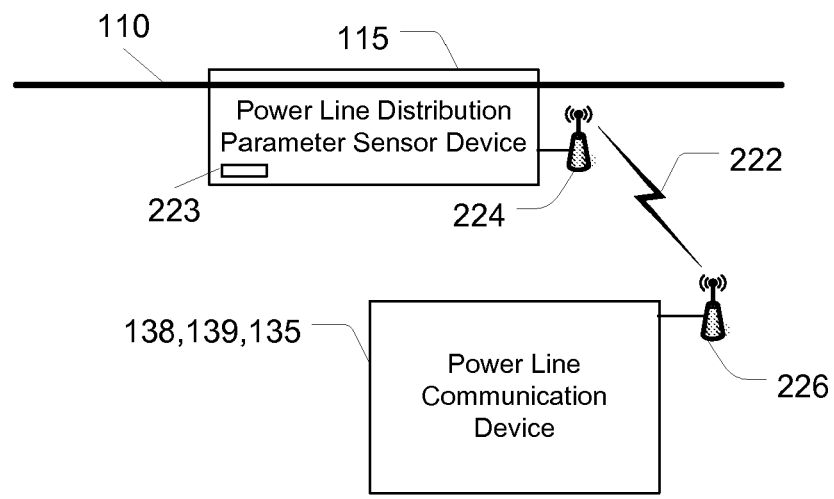
FIG. 4 is a block diagram of a power line parameter sensor device coupled to a power line communication device by a wireless medium.
Figure 5:
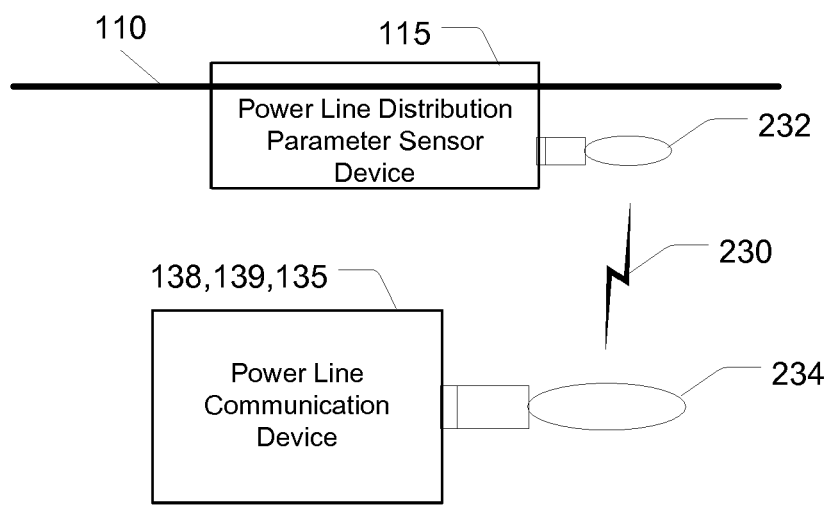
FIG. 5 is a block diagram of a power line parameter sensor device coupled to a power line communication device by a wireless medium.

FIGS. 3, 4 and 5 show different manners of coupling the power line parameter sensor device 115 to the power line communication device 138, 139, 135, via a non-conductive communication link to provide electrical isolation (when necessary) from the medium voltage power line 110. In FIG. 3, a wired medium 220 carries measurement data from the power line parameter sensor device 115 to the power line communication device 138, 139, 135. For underground insulated MV power lines and for low voltage power lines (which are also usually insulated), the wired medium 220 may comprise a conductive wire (i.e., a pair or wires). For overhead un-insulated MV power lines, however, the wired medium 220 may include a fiber optic cable or other wired medium that does not conduct high voltages. In such embodiment the power line parameter sensor device 115 and power line communication device 138, 139, 135 each may include a fiber optic transceiver (or fiber optic transmitter in the sensor device 115 and an optic receiver in the communication device). The fiber optic cable may carry analog or digitized sensor data to the power line communication device 138, 139, 135. In some embodiments such as this one, the sensor device 115 may require a power source (i.e., an energy harvesting system) for powering the fiber optic transceiver and other components (such as an ADC) of the sensor device 115. In one example embodiment, power may be sent over a fiber optic cable as an optical signal from the power line communication device 138, 139, 135 (or another device) to the sensor device 115, where the photonic energy is converted to electrical energy to power the fiber optic transmitter (that may form part of a transceiver) and other components of the power line parameter sensor device 115 via a power supply 221. In other words, a photonic power delivery system may be used whereby light from a laser source illuminates a highly efficient photovoltaic power converter at the sensor device 115 to produce electrical power. An example embodiment of a photonic power supply system and method is described in U.S. patent application Ser. No. 10/292,745 filed on Nov. 12, 2002, entitled, "Floating Power Supply and Method of Using the Same," which is incorporated herein by reference in its entirety. In an alternative embodiment the power line parameter sensor device 115 may include a different power system, such as a solar cell or battery, or kinetic energy converter (e.g., to convert vibrations to electrical energy), to provide power to the sensor device 115 circuits. As still another alternative, a power supply 221 may derive power from the power line 110 via inductance. Specifically, a transformer may be formed by a magnetically permeable core placed substantially around the entire circumference of power line 110 (perhaps with a gap) and a winding around the core. The power line 110, core, and winding form a transformer with the winding connected to the power supply 221. Current through the power line 110 induces a current in the winding, which supplies power to the sensor device 115 (for use by its transmitter and/or other components). Collectively, such power sources such as these (photonic, solar, battery, kinetic (e.g., from vibrations), and inductive power systems), which derive power via a method that isolates the MV power line voltage from the LV power line and the power line communication device, shall be referred to herein as an isolated power source. Isolated power sources other the examples described herein may be employed as well.

FIG. 4 shows an embodiment in which a wireless link 222 carries measurement data from the power line parameter sensor device 115 to the power line communication device 138, 139, 135. In such embodiment the interface 206 may include a wireless transceiver 224 (e.g., IEEE 802.11 a,b,g, or n or Bluetooth®, ISM band transceiver) or wireless transmitter which communicates with a wireless transceiver 226 (or receiver) of the power line communication device 138, 139, 135. In some such embodiments the power line parameter sensor device 116 also may include a power supply 223 with an isolated power source such as a solar cell, battery, a photonic power source, or an MV inductive power source, to provide power to the sensor device 115 circuits. When multiple sensor devices 115 are connected to a power line communication device 138, 139, or 135, the wireless methods may include means for coordinating the transmissions from individual sensor devices 115 so that they do not interfere with each other and so that the power line communication device can determine the source of the data. For example, a transceiver may use the ISM bands (915 MHz) and use an "ID Code" embedded in the data to identify the sensor device 115. Alternately, the links may communicate via different frequency bands.

FIG. 5 shows another embodiment in which a wireless link 230 carries measurement data from a radio frequency identification (RFID) transponder 232 of a power line parameter sensor device 115 to the power line communication device 138, 139, 135. In various embodiments the sensor transponder 232 may be passive (having no power source of its own) or active (having its own power source). For example, in one embodiment the interface includes a passive radio transponder 232. The power line communication device 138, 139, 135 also includes a transponder 234 which transmits a signal to the power line parameter sensor device 115. The strength of the transmitted signal may provide enough power to drive the power line parameter sensor transponder 232 and, if necessary, the sensor's 115 other components as well. The sensor device 115 powers up, gathers one or more samples of the power line current, voltage, and/or other data, and transmits the sampled data back to the power line communication device 138, 139, 135 via transponder 232. In another embodiment the sensor device includes an active radio transponder having its own power supply, which may have an isolated power source as described herein.

In various embodiments, data from the sensor devices 115 of the system or within a region or neighborhood covered by a sub-portion of the system may be sampled substantially simultaneously (e.g., all sensor devices 115 sample within a thirty second, sixty second, three minute, or five minute time period). Such samples may be gathered at a set scheduled time, at regular times, at regular intervals, or in response to a command received from a remote computer. Uses of the measured (and processed) power line parameter data are described below in more detail.

In the embodiments described herein and others, the invention may employ a communication method that reduces the power needed to communicate the measured data over the non-conductive communication link. Specifically, reducing the power needed to communicate the data allows the sensor device to communicate data when very little power is available (e.g., from the isolated power source). In one example embodiment, the sensor device 115 includes a timing circuit that periodically wakes up the sensing and memory circuits (e.g., analog to digital converter and memory) from a reduced power state (e.g., hibernation or standby state) to allow the measurement(s) to be taken (samples converted to digital data), processed, and stored in memory. In addition, after a predetermined number of measurements have been taken and the associated data stored, the communication circuitry of the interface 206 may be woken up to transmit the stored data to the power line communication device 138, 139, 135 via the non-conductive communication link (e.g., the fiber optic conductor, through the air via a wireless transmitter or transceiver, etc.).

In one example embodiment, the communication circuitry is configured to transmit a plurality of samples of the parameter data in a bursting transmission, which may comprise a relatively high transmission rate and relatively short transmission time. Specifically, over a given time period (e.g., a day) a plurality of bursts of the parameter data may be transmitted, with each burst transmitting data a plurality of the stored samples. The bursting at high data rates may allow the transmitter of the interface 206 of the sensor device 206 to remain powered down (or in a low power use state) a high percentage of the time. The bursting transmission over a time period (e.g., an hour or day) may have an extremely low duty cycle such as less than 0.01 (1%), more preferably less than 0.001 (0.1%), even more preferably less than 0.0001 (0.01%), and still more preferably less than 0.00001 (0.001%).

Backhaul Node 132:

Other communication nodes, such as access nodes, repeaters, and other backhaul nodes, may communicate to and from the IP network (which may include the Internet) via a backhaul node 132. In one example embodiment, a backhaul node 132 comprises a backhaul device 138. The backhaul device 138, for example, may transmit communications directly to an aggregation point 124, or to a distribution point 127 which in turn transmits the data to an aggregation point 124.

Figure 6:
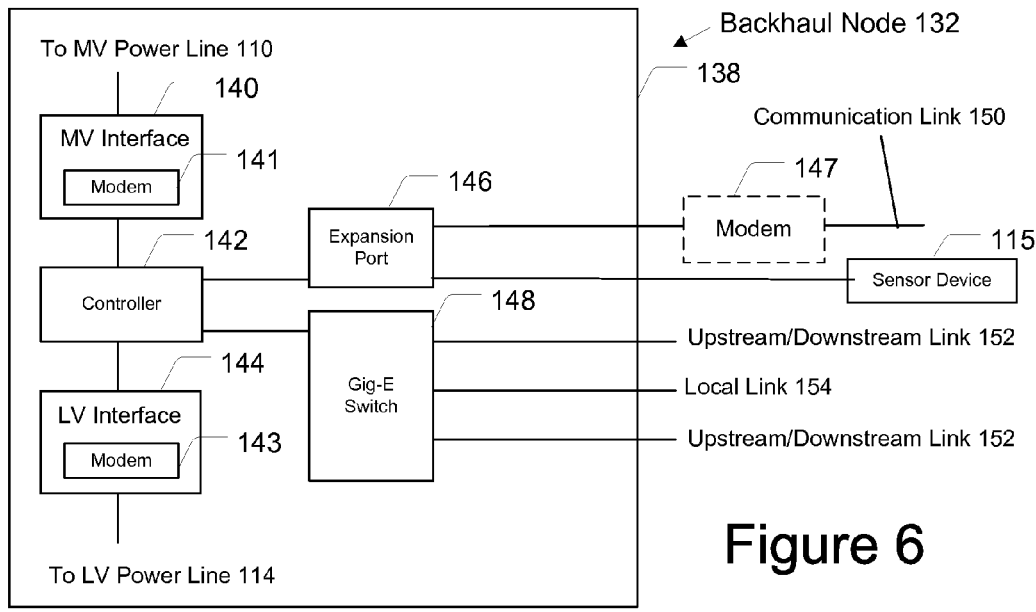
FIG. 6 is a block diagram of an example embodiment of a backhaul node.
Figure 7:
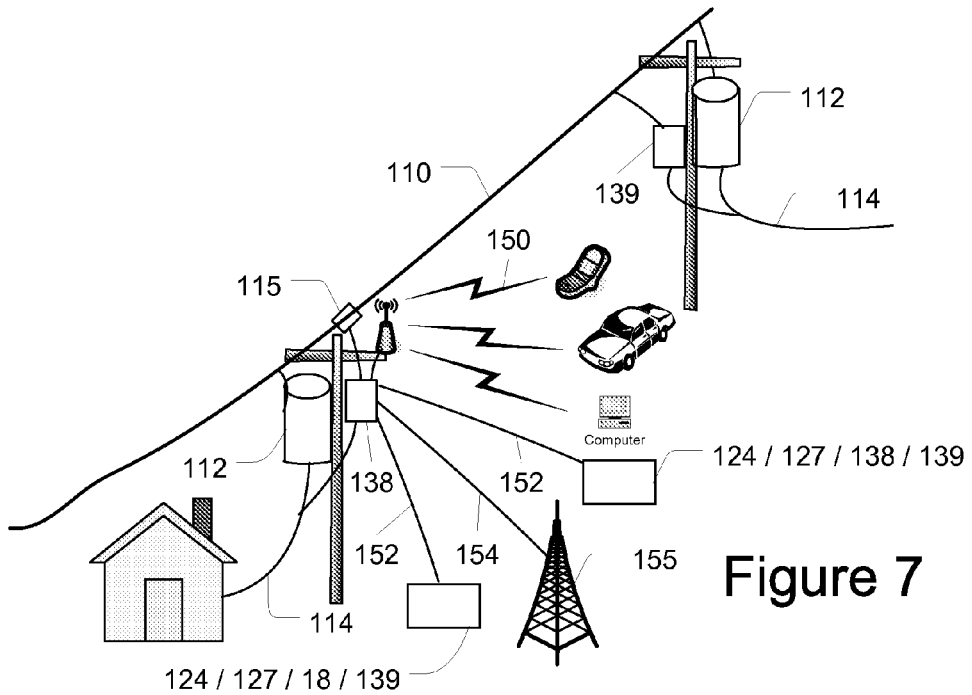
FIG. 7 illustrates an implementation of an example embodiment of a backhaul node.

FIGS. 6 and 7 show an example embodiment of a backhaul device 138 which may form all or part of a backhaul node 132. The backhaul device 138 may include a medium voltage power line interface (MV Interface) 140, a controller 142, an expansion port 146, and a gigabit Ethernet (gig-E) switch 148. In some embodiments the backhaul device 138 also may include a low voltage power line interface (LV interface) 144. The MV interface 140 is used to communicate over the MV power lines and may include an MV power line coupler coupled to an MV signal conditioner, which may be coupled to an MV modem 141. The MV power line coupler prevents the medium voltage power from passing from the MV power line 110 to the rest of the device's circuitry, while allowing the communications signal to pass between the backhaul device 138 and the MV power line 110. The MV signal conditioner may provide amplification, filtering, frequency translation, and transient voltage protection of data signals communicated over the MV power lines 110. Thus, the MV signal conditioner may be formed by a filter, amplifier, a mixer and local oscillator, and other circuits which provide transient voltage protection. The MV modem 141 may demodulate, decrypt, and decode data signals received from the MV signal conditioner and may encode, encrypt, and modulate data signals to be provided to the MV signal conditioner.

The backhaul device 138 also may include a low voltage power line interface (LV Interface) 144 for receiving and transmitting data over an LV power line 114. The LV interface 144 may include an LV power line coupler coupled to an LV signal conditioner, which may be coupled to an LV modem 143. In one embodiment the LV power line coupler may be an inductive coupler. In another embodiment the LV power line coupler may be a conductive coupler. The LV signal conditioner may provide amplification, filtering, frequency translation, and transient voltage protection of data signals communicated over the LV power lines 114. Data signals received by the LV signal conditioner may be provided to the LV modem 143. Thus, data signals from the LV modem 143 are transmitted over the LV power lines 110 through the signal conditioner and coupler. The LV signal conditioner may be formed by a filter, amplifier, a mixer and local oscillator, and other circuits which provide transient voltage protection. The LV modem 143 may demodulate, decrypt, and decode data signals received from the LV signal conditioner and may encode, encrypt, and modulate data signals to be provided to the LV signal conditioner.

The backhaul device 138 also may include an expansion port 146, which may be used to connect to a variety of devices. For example a wireless access point, which may include a wireless transceiver or modem 147, may be integral to or coupled to the backhaul device 138 via the expansion port 146. The wireless modem 147 may establish and maintain a communication link 150. In other embodiments a communication link is established and maintained over an alternative communications medium (e.g., fiber optic, cable, twisted pair) using an alternative transceiver device. In such other embodiments the expansion port 146 may provide an Ethernet connection allowing communications with various devices over optical fiber, coaxial cable or other wired medium. In such embodiment the modem 147 may be an Ethernet transceiver (fiber or copper) or other suitable modem may be employed (e.g., cable modem, DSL modem). In other embodiments, the expansion port may be coupled to a Wifi access point (IEEE 802.11 transceiver), WiMAX (IEEE 802.16), or mobile telephone cell site. The expansion port may be employed to establish a communication link 150 between the backhaul device 138 and devices at a residence, building, other structure, another fixed location, or between the backhaul device 138 and a mobile device.

Various sensor devices 115 also may be connected to the backhaul device 138 through the expansion port 146 or via other means (e.g., a dedicated sensor interface not shown). Exemplary sensors that may be coupled to the backhaul device 138 may include a power distribution parameter sensor 116 (which may comprise current sensor device 115 or a voltage sensor device), a level sensor (to determine pole tilt), a camera (e.g., for monitoring security, detecting motion, monitoring children's areas, monitoring a pet area), an audio input device (e.g., microphone for monitoring children, detecting noises), a vibration sensor, a motion sensor (e.g., an infrared motion sensor for security), a home security system, a smoke detector, a heat detector, a carbon monoxide detector, a natural gas detector, a thermometer, a barometer, a biohazard detector, a water or moisture sensor, a temperature sensor, and a light sensor. The expansion port may provide direct access to the core processor (which may form part of the controller 142) through a MII (Media Independent Interface), parallel, serial, or other connection. This direct processor interface may then be used to provide processing services and control to devices connected via the expansion port thereby allowing for a more less expensive device (e.g., sensor). The power parameter sensor device 115 may measure and/or detect one or more parameters, which, for example, may include power usage data, power line voltage data, power line current data, detection of a power outage, detection of water in a pad mount, detection of an open pad mount, detection of a street light failure, power delivered to a transformer data, power factor data (e.g., the phase angle between the voltage and current of a power line), power delivered to a downstream branch data, data of the harmonic components of a power signal, load transients data, and/or load distribution data. In addition, the backhaul device 138 may include multiple sensor devices 115 so that parameters of multiple power lines may be measured such as a separate parameter sensor device 116 on each of three MV power line conductors and a separate parameter sensor on each of two energized LV power line conductors and one on each neutral conductor. One skilled in the art will appreciate that other types of utility data also may be gathered. As will be evident to those skilled in the art, the expansion port may be coupled to an interface for communicating with the interface 206 of the sensor device 116 via a non-conductive communication link.

The backhaul device 138 also may include a gigabit Ethernet (Gig-E) switch 148. Gigabit Ethernet is a term describing various technologies for implementing Ethernet networking at a nominal speed of one gigabit per second, as defined by the IEEE 802.3z and 802.3ab standards. There are a number of different physical layer standards for implementing gigabit Ethernet using optical fiber, twisted pair cable, or balanced copper cable. In 2002, the IEEE ratified a 10 Gigabit Ethernet standard which provides data rates at 10 gigabits per second. The 10 gigabit Ethernet standard encompasses seven different media types for LAN, MAN and WAN. Accordingly the gig-E switch may be rated at 1 gigabit per second (or greater as for a 10 gigabit Ethernet switch).

The switch 148 may be included in the same housing or co-located with the other components of the node (e.g., mounted at or near the same utility pole or transformer). The gig-E switch 148 maintains a table of which communication devices are connected to which switch 148 port (e.g., based on MAC address). When a communication device transmits a data packet, the switch receiving the packet determines the data packet's destination address and forwards the packet towards the destination device rather than to every device in a given network. This greatly increases the potential speed of the network because collisions are substantially reduced or eliminated, and multiple communications may occur simultaneously.

The gig-E switch 148 may include an upstream port for maintaining a communication link 152 with an upstream device (e.g., a backhaul node 132, an aggregation point 124, a distribution point 127), a downstream port for maintaining a communication link 152 with a downstream device (e.g., another backhaul node 134; an access node 134), and a local port for maintaining a communication link 154 to a Gig-E compatible device such as a mobile telephone cell cite 155 (i.e., base station), a wireless device (e.g., WiMAX (IEEE 802.16) transceiver), an access node 134, another backhaul node 132, or another device. In some embodiments the gig-E switch 148 may include additional ports.

In one embodiment, the link 154 may be connected to mobile telephone cell site configured to provide mobile telephone communications (digital or analog) and use the signal set and frequency bands suitable to communicate with mobile phones, PDAs, and other devices configured to communicate over a mobile telephone network. Mobile telephone cell sites, networks and mobile telephone communications of such mobile telephone cell sites, as used herein, are meant to include analog and digital cellular telephone cell sites, networks and communications, respectively, including, but not limited to AMPS, 1G, 2G, 3G, GSM (Global System for Mobile communications), PCS (Personal Communication Services) (sometimes referred to as digital cellular networks), 1× Evolution-Data Optimized (EVDO), and other cellular telephone cell sites and networks. One or more of these networks and cell sites may use various access technologies such as frequency division multiple access (FDMA), time division multiple access (TDMA), or code division multiple access (CDMA) (e.g., some of which may be used by 2G devices) and others may use CDMA2000 (based on 2G Code Division Multiple Access), WCDMA (UMTS)—Wideband Code Division Multiple Access, or TD-SCDMA (e.g., some of which may be used by 3G devices).

The gig-E switch 148 adds significant versatility to the backhaul device 138. For example, several backhaul devices may be coupled in a daisy chain topology (see FIG. 11), rather than by running a different fiber optic conductor to each backhaul node 134. Additionally, the local gig-E port allows a communication link 154 for connecting to high bandwidth devices (e.g., WiMAX (IEEE 802.16) or other wireless devices). The local gig-E port may maintain an Ethernet connection for communicating with various devices over optical fiber, coaxial cable or other wired medium. Exemplary devices may include user devices 130, a mobile telephone cell cite 155, and sensors (as described above with regard to the expansion port 146.

Communications may be input to the gig-E switch 148 from the MV interface 140, LV interface 144 or expansion port 146 through the controller 142. Communications also may be input from each of the upstream port, local port and downstream port. The gig-E switch 148 may be configured (by the controller 142 dynamically) to direct the input data from a given input port through the switch 148 to the upstream port, local port, or downstream port. An advantage of the gig-E switch 148 is that communications received at the upstream port or downstream port need not be provided (if so desired) to the controller 142. Specifically, communications received at the upstream port or downstream port may not be buffered or otherwise stored in the controller memory or processed by the controller. (Note, however, that communications received at the local port may be directed to the controller 142 for processing or for output over the MV interface 140, LV interface 144 or expansion port 146). The controller 142 controls the gig-E switch 148, allowing the switch 148 to pass data upstream and downstream (e.g. according to parameters (e.g., prioritization, rate limiting, etc.) provided by the controller). In particular, data may pass directly from the upstream port to the downstream port without the controller 142 receiving the data. Likewise, data may pass directly from the downstream port to the upstream port without the controller 142 receiving the data. Also, data may pass directly from the upstream port to the local port in a similar manner; or from the downstream port to the local port; or from the local port to the upstream port or downstream port. Moving such data through the controller 142 would significantly slow communications or require an ultra fast processor in the controller 142. Data from the controller 142 (originating from the controller 142 or received via the MV interface 140, the LV interface 144, or expansion port 146) may be supplied to the Gig-E switch 148 for communication upstream (or downstream) via the upstream port (or downstream port) according to the address of the data packet. Thus, data from the controller 142 may be multiplexed in (and routed/switched) along with other data communicated by the switch 148. As used herein, to route and routing is meant to include the functions performed by of any a router, switch, and bridge.

The backhaul device 138 also may include a controller 142 which controls the operation of the device 138 by executing program codes stored in memory. In addition, the program code may be executable to process the measured parameter data to, for example, convert the measured data to current, voltage, or power factor data. The backhaul 138 may also include a router, which routes data along an appropriate path. In this example embodiment, the controller 142 includes program code for performing routing (hereinafter to include switching and/or bridging). Thus, the controller 142 may maintain a table of which communication devices are connected to port in memory. The controller 142, of this embodiment, matches data packets with specific messages (e.g., control messages) and destinations, performs traffic control functions, performs usage tracking functions, authorizing functions, throughput control functions and similar related services. Communications entering the backhaul device 138 from the MV power lines 110 at the MV interface 140 are received, and then may be routed to the LV interface 144, expansion port 146 or gig-E switch 148. Communications entering the backhaul device 138 from the LV power lines 114 at the LV interface 144 are received, and may then be routed to the MV interface 140, the expansion port 146, or the gig-E switch 148. Communications entering the backhaul device 138 from the expansion port 146 are received, and may then be routed to the MV interface 140, the LV interface 144, or the gig-E switch 148. Accordingly, the controller 142 may receive data from the MV interface 140, LV interface 144 or the expansion port 146, and may route the received data to the MV interface 140, LV interface 144, the expansion port 146, or gig-E switch 148. In this example embodiment, user data may be routed based on the destination address of the packet (e.g., the IP destination address). Not all data packets, of course, are routed. Some packets received may not have a destination address for which the particular backhaul device 138 routes data packets. Additionally, some data packets may be addressed to the backhaul device 138 itself, in which case the backhaul device may process the data as a control message.

Figure 8:
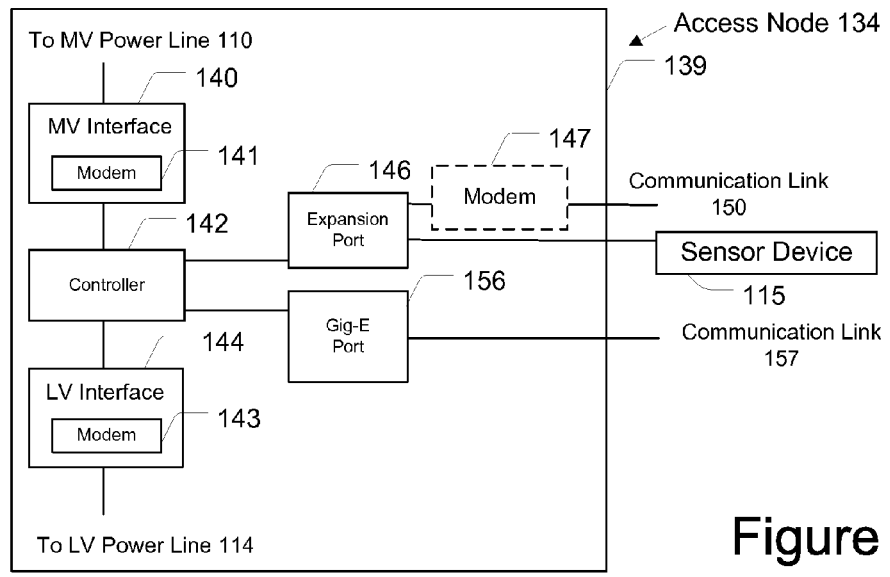
FIG. 8 is a block diagram of an example embodiment of an access node.
Figure 9:
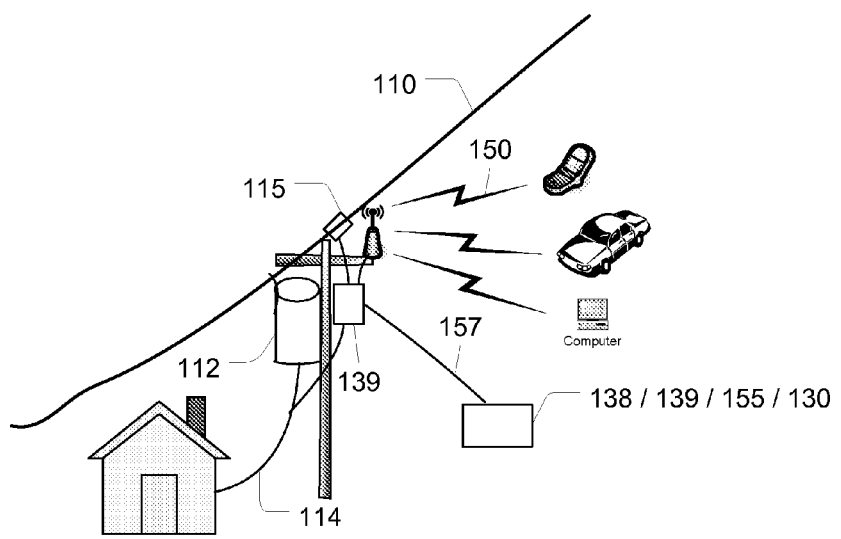
FIG. 9 illustrates an implementation of an example embodiment of an access node.

Access Node 134:

The backhaul nodes 132 may communicate with user devices via one or more access nodes 134, which may include an access device 139. FIGS. 8-9 show an example embodiment of such an access device 139 for providing communication services to mobile devices and to user devices at a residence, building, and other locations. Although FIG. 9 shows the access node 134 coupled to an overhead power line, in other embodiments an access node 134 (and its associated sensor devices 115) may be coupled to an underground power line.

In one example embodiment, access nodes 124 provide communication services for user devices 130 such as security management; IP network protocol (IP) packet routing; data filtering; access control; service level monitoring; service level management; signal processing; and modulation/demodulation of signals transmitted over the communication medium.

The access device 139 of this example node 134 may include a bypass device that moves data between an MV power line 110 and an LV power line 114. The access device 139 may include a medium voltage power line interface (MV Interface) 140 having a MV modem 141, a controller 142, a low voltage power line interface (LV interface) 144 having a LV modem 143, and an expansion port 146, which may have the functionality, functional components (and for connecting to devices, such as power line parameter sensor device 115) as previously described above with regard of the backhaul device 138. The access device 139 also may include a gigabit Ethernet (gig-E) port 156. The gig-E port 156 maintains a connection using a gigabit Ethernet protocol as described above for the gig-E switch 146 of FIG. 6. The power parameter sensor device 116 may be connected to the access device 139 to measure and/or detect one or more parameters of the MV power or the LV power line, which, for example, may include power usage data, power line voltage data, power line current data, detection of a power outage, detection of water in a pad mount, detection of an open pad mount, detection of a street light failure, power delivered to a transformer data, power factor data (e.g., the phase angle between the voltage and current of a power line), power delivered to a downstream branch data, data of the harmonic components of a power signal, load transients data, and/or load distribution data. In addition, the access device 134 may include multiple sensor devices 116 so that parameters of multiple power lines may be measured such as a separate parameter sensor device 116 on each of three MV power line conductors and a separate parameter sensor on each of two energized LV power line conductors and one on each neutral conductor. One skilled in the art will appreciate that other types of utility data also may be gathered. The sensor devices 115 described herein may be co-located with the power line communication device with which the sensor device 115 communicates or may displaced therefrom (e.g., at the next utility pole or transformer).

The Gig-E port 156 may maintain an Ethernet connection for communicating with various devices over optical fiber, coaxial cable or other wired medium. For example, a communication link 157 may be maintained between the access device 139 and another device through the gig-E port 156. For example, the gig-E port 156 may provide a connection to user devices 130, sensors (as described above with regard to the expansion port 146, such as to power line parameter sensor device 115), or a cell station 155.

Communications may be received at the access device 139 through the MV interface 140, LV interface 144, expansion port 146 or gig-E port 156. Communications may enter the access device 139 from the MV power lines 110 through the MV interface 140, and then may be routed to the LV interface 142, expansion port 146 or gig-E port 156. Communications may enter the access device 139 from the LV power lines 114 through the LV interface 144, and then may be routed to the MV interface 140, the expansion port 146, or the gig-E port 156. Communications may enter the access device 139 from the expansion port 146, and then may routed to the MV interface 140, the LV interface 144, or the gig-E port 156. Communications may enter the access device 139 via the gig-E port 156, and then may be routed to the MV interface 140, the LV interface 144, or the expansion port 146. The controller 142 controls communications through the access device 139. Accordingly, the access device 139 receives data from the MV interface 140, LV interface 144, the expansion port 146, or the gig-E port 156 and may route the data to the MV interface 140, LV interface 144, expansion port 146, or gig-E port 156 under the direction of the controller 142. In one example embodiment, the access node 134 may be coupled to a backhaul node 132 via a wired medium coupled to Gig-E port 156 while in another embodiment, the access node is coupled to the backhaul node 132 via an MV power line (via MV interface 140). In yet another embodiment, the access node 134 may be coupled to a backhaul node 132 via a wireless link (via expansion port 146 or Gig-E port 156). In addition, the controller may include program code that is executable to control the operation of the device 139 and to process the measured parameter data to, for example, convert the measured data to current, voltage, or power factor data.

Other Devices:

Another communication device is a repeater (e.g., indoor, outdoor, low voltage (LVR) and/or medium voltage) which may form part of a repeater node 135 (see FIG. 1). A repeater serves to extend the communication range of other communication elements (e.g., access devices, backhaul devices, and other nodes). The repeater may be coupled to power lines (e.g., MV power line; LV power line) and other communication media (e.g., fiber optical cable, coaxial cable, T-1 line or wireless medium). Note that in some embodiments, a repeater node 135 may also include a device for providing communications to a user device 130 (and thus also serve as an access node 134).

In various embodiments a user device 130 is coupled to an access node 134 using a modem. For a power line medium, a power line modem 136 is used. For a wireless medium, a wireless modem is used. For a coaxial cable, a cable modem is may be used. For a twisted pair, a DSL modem may be used. The specific type of modem depends on the type of medium linking the access node 134 and user device 130.

In addition, the PLCS may include intelligent power meters, which, in addition to measuring power, may include a parameter sensor device 115 and also have communication capabilities (a controller coupled to a modem coupled to the LV power line) for communicating the measured parameter data to the access node 134. Detailed descriptions of some examples of such power meter modules are provided in U.S. patent application Ser. No. 11/341,646, filed on Jan. 30, 2006 entitled, "Power Line Communications Module and Method," which is hereby incorporated herein by reference in it entirety.

A power line modem 136 couples a communication onto or off of an LV power line 114. A power line modem 136 is coupled on one side to the LV power line. On the other side, the power line modem 136 includes a connector to connect to a wired or wireless medium leading to the user device 130. One protocol for communicating with access nodes 132 over an LV power line is the HomePlug 1.0 standard of the Home-Plug® Alliance for routing communications over low voltage power lines. In this manner, a customer can connect a variety of user devices 130 to the communication network 104.

The parameter sensor devices 115 and applications for using the related data also be incorporated in power line communication systems that communicate over underground power lines. Detailed descriptions of the components, features, and power line communication devices of some example underground PLCSs are provided in U.S. patent application Ser. No. 11/399,529 filed on Apr. 7, 2006 entitled, "Power Line Communications Device and Method," which is hereby incorporated herein by reference in its entirety. The parameter sensor devices 115 described herein (or portions thereof) may be formed in or integrated with couplers for coupling communication signals to and from the power lines. For example, the Rogowski coils described above may be attached to the transformer side of the coupler (or integrated into the coupler) that couples to the underground (or overhead) MV power lines to allow installation of the coupler to also accomplish installation of the sensor device 115.

Network Communication Protocols:

The communication network 104 may provide high speed internet access and other high data-rate data services to user devices, homes, buildings and other structure, and to each room, office, apartment, or other unit or sub-unit of multi-unit structure. In doing so, a communication link is formed between two communication nodes 128 over a communication medium. Some links are formed by using a portion 101 of the power system infrastructure. Specifically, some links are formed over MV power lines 110, and other links are formed over LV power lines 114. Still other links may be formed over another communication media, (e.g., a coaxial cable, a T-1 line, a fiber optic cable, wirelessly (e.g., IEEE 802.11 a/b/g, 802.16, 1G, 2G, 3G, or satellite such as WildBlue®)). Some links may comprise wired Ethernet, multipoint microwave distribution system (MMDS) standards, DOCSIS (Data Over Cable System Interface Specification) signal standards or another suitable communication method. The wireless links may also use any suitable frequency band. In one example, frequency bands are used that are selected from among ranges of licensed frequency bands (e.g., 6 GHz, 11 GHz, 18 GHz, 23 GHz, 24 GHz, 28 GHz, or 38 GHz band) and unlicensed frequency bands (e.g., 900 MHz, 2.4 GHz, 5.8 GHz, 24 GHz, 38 GHz, or 60 GHz (i.e., 57-64 GHz)).

Accordingly, the communication network 104 includes links that may be formed by power lines, non-power line wired media, and wireless media. The links may occur at any point along a communication path between a backhaul node 132 and a user device 130, or between a backhaul node 132 and a distribution point 127 or aggregation point 124.

Communication among nodes 128 may occur using a variety of protocols and media. In one example, the nodes 128 may use time division multiplexing and implement one or more layers of the 7 layer open systems interconnection (OSI) model. For example, at the layer 3 'network' level, the devices and software may implement switching and routing technologies, and create logical paths, known as virtual circuits, for transmitting data from node to node. Similarly, error handling, congestion control and packet sequencing can be performed at Layer 3. In one example embodiment, Layer 2 'data link' activities include encoding and decoding data packets and handling errors of the 'physical' layer 1, along with flow control and frame synchronization. The configuration of the various communication nodes may vary. For example, the nodes coupled to power lines may include a modem that is substantially compatible with the HomePlug 1.0 or A/V standard. In various embodiments, the communications among nodes may be time division multiple access or frequency division multiple access.

Software

The communication network 104 may be monitored and controlled via a power line server that may be remote from the structure and physical location of the network elements. The controller of the nodes 128 describe herein may include executable program code for controlling the operation of the nodes and responding to commands. The PLS may transmit any number of commands to a backhaul nodes 132 and access nodes 134 to manage the system. As will be evident to those skilled in the art, most of these commands are equally applicable for backhaul nodes 132 and access nodes 134. For ease of discussion, the description of the commands will be in the context of a node 128 (meant to include both). These commands may include altering configuration information, synchronizing the time of the node 128 with that of the PLS, controlling measurement intervals (e.g., voltage measurements), requesting measurement or data statistics, requesting the status of user device activations, rate shaping, and requesting reset or other system-level commands. Any or all of these commands may require a unique response from the node 128, which may be transmitted by the node 128 and received and stored by the PLS. The PLS may include software to transmit a command to any or all of the nodes (134 and 132) to schedule a voltage and/or current measurement at any particular time so that all of the network elements of the PLCS take the measurement(s) at the same time.

Alerts

In addition to commands and responses, the node 128 has the ability to send Alerts and Alarms to the PLS. Alerts typically are either warnings or informational messages transmitted to the PLS in light of events detected or measured by the node 128. Alarms typically are error conditions detected.

One example of an Alarm is an Out-of-Limit Alarm that indicates that an out-of-limit condition has been detected at the node 128, which may indicate a power outage on the LV power line, an MV or LV voltage too high, an MV or LV voltage too low, a temperature measurement inside the node 128 is too high, and/or other out-of-limit conditions. Information of the Out-of-Limit condition, such as the type of condition (e.g., a LV voltage measurement, a node 128 temperature), the Out-of-Limit threshold exceeded, the time of detection, the amount (e.g., over, under, etc.) the out of limit threshold has been exceeded, is stored in the memory of the node 128 and transmitted with the alert or transmitted in response to a request from the PLS.

Software Upgrade Handler

The Software Upgrade Handler software may be started by the node 128 Command Processing software in response to a PLS command. Information needed to download the upgrade file, including for example the remote file name and PLS IP address, may be included in the parameters passed to the Software Command Handler within the PLS command.

Upon startup, the Software Command Handler task may open a file transfer program such as Trivial File Transfer Protocol (TFTP) to provide a connection to the PLS and request the file. The requested file may then be downloaded to the node 128. For example, the PLS may transmit the upgrade through the Internet to the node 128 (and perhaps through the backhaul node, and over the MV power line) where the upgrade may be stored in a local RAM buffer and validated (e.g., error checked) while the node 128 continues to operate (i.e., continues to communicate packets). Finally, the task copies the downloaded software into a backup boot page in non-volatile memory, and transmits an Alert indicating successful installation to the PLS. The node 128 then makes the downloaded software the primary boot page and reboots. When the device restarts the downloaded software will be copied to RAM and executed. The device will then notify the PLS that it has rebooted via an alert indicating such. In addition, and through substantially the same procedure, new software code may be received by the controller for storage in (e.g., to replace existing code) and execution at the media access control (MAC) layer of the LV modem and/or the MV modem of the access device or the backhaul device.

ADC Scheduler

Any of the nodes described herein may include an analog to digital converter (ADC) for measuring the voltage, current, and/or other parameters of any power line 110, 114. The ADC may be located within the power line parameter sensor device 115 or within the power line communication device 138, 139, 135. The ADC Scheduler software, in conjunction with the real-time operating system, creates ADC scheduler tasks to perform ADC sampling according to configurable periods for each sample type. Each sample type corresponds with an ADC channel. The ADC Scheduler software creates a scheduling table in memory with entries for each sampling channel according to default configurations or commands received from the PLS. The table contains timer intervals for the next sample for each ADC channel, which are monitored by the ADC scheduler.

ADC Measurement Software

The ADC Measurement Software, in conjunction with the real-time operating system, creates ADC measurement tasks that are responsible for monitoring and measuring data accessible through the ADC 330 such as the power distribution parameter sensor devices 115 (including the current sensor devices 115 and voltage sensor devices) described herein. Each separate measurable parameter may have an ADC measurement task. Each ADC measurement task may have configurable rates for processing, recording, and reporting for example.

An ADC measurement task may wait on a timer (set by the ADC scheduler). When the timer expires the task may retrieve all new ADC samples for that measurement type from the sample buffer, which may be one or more samples. The raw samples are converted into a measurement value. The measurement is given the timestamp of the last ADC sample used to make the measurement. The measurement may require further processing. If the measurement (or processed measurement) exceeds limit values, an alert condition may be generated. Out of limit Alerts may be transmitted to the PLS and repeated at the report rate until the measurement is back within limits. An out of limit recovery Alert may be generated (and transmitted to the PLS) when the out of limit condition is cleared (i.e., the measured value falls back within limit conditions).

The measurements performed by the ADC, each of which has a corresponding ADC measurement task, may include node 128 inside temperature, LV power line voltage, LV power line current, MV power line voltage, and/or MV power line current for example. MV and LV power line measurements may be accomplished via the power line parameter sensor devices 115.

As discussed, the nodes may include value limits for most of these measurements stored in memory with which the measured value may be compared. If a measurement is below a lower limit, or above an upper limit (or otherwise out of an acceptable range), the node 128 may transmit an Out-of-Limit Alert. Such alert may be received and stored by the PLS. In some instances, one or more measured values are processed to convert the measured value(s) to a standard or more conventional data value.

The LV power line voltage measurement may be used to provide various information. For example, the measurement may be used to determine a power outage (and subsequently a restoration), or measure the power used by a consumer (when current data is also available) or by all of the consumers connected to that distribution transformer. In addition, it may be used to determine the power quality of the LV power line by measuring and processing the measured values over time to provide frequency, harmonic content, and other power line quality characteristics.

A more extensive listing of exemplary uses of the measured power line parameter data is provided below.

Applications of Power Line Parameter Data:

Power line distribution parameter data may be gathered at regular times, periodically, aperiodically, at one or more scheduled times, or in response to specific commands or triggering events. Also, the power line distribution parameter may be simultaneously measured from one sensor device, multiple sensor devices or all sensor devices 115 of a single power line communication device or all power line communication devices. For example, parameter data of a building, neighborhood, a city, a country, or other region may be measured. Alternately, data for the entire power line distribution system 104 may be collected. By gathering power line distribution parameter data, such as power line current, power line voltage, power factor data, load or other parameter, the efficiency of the power line distribution system may be improved. For example, real time monitoring of power line current at many locations (such as many MV power line locations) within the power line distribution system may enable switches in the system (MV feeder switches) to be reconfigured to redistribute the load (i.e., the flow of current) in response to measured data. The redistribution may be done manually (e.g., by sending personnel), semi-automatically (e.g., by personnel remotely actuating the switch(es)), and/or automatically (e.g., actuation of the switch(es) via a remote computer executing program code that transmits control information to actuate the switch). For example, when one area habitually uses less power, that excess capacity can be utilized to supply more heavily loaded areas, to optimize utilization of the installed infrastructure.

In addition, by monitoring fault current and thereby locating faults, the duration of the power outage may be reduced to consumers. By detecting a high impedance (low current) fault on a MV power line, a break in the overhead power line may be traced to a location, such as where current still flows, but at a reduced amount because the overhead power line is 'dancing' on the asphalt, averting a significant safety hazard. By analyzing trends in power line current and short duration changes, transient faults may be located. By comparing the current output from a transformer with metered current at premises, detection of power theft may be identified and located. Current overloads may be identified to a specific device, signifying that such device should be replaced. Overloads also may be detected at a specific conductor, signifying that such conductor should be replaced. Overloads may be detected at a specific transformer, signifying that such transformer should be replaced. After a power outage, the measured current data may be used in selecting the MV power line switching sequences to restore power to specific areas. A switch may be evaluated by monitoring current across the switch (i.e., when in the normally closed position) to ensure that the switch is off and not faulty. A tie switch inadvertently left closed may be identified and located via current data. The measured current data may be used to derive the power factor, which in turn may be used to determine if load in an area is too reactive (e.g. to inductive). When too the load is too reactive, a switch may be actuated to insert or take out a capacitor bank for such area. By looking for a specific voltage and/or current signature pattern, such as a step function, an incipient failure of a transformer may be detected, and notice provided to the utility to replace the transformer. High voltage exceptions may be identified and located and low voltage exceptions may be identified and located. Voltage drops on secondary service loops can be characterized and the system reinforced if indicated.

Maintenance of the power line distribution system may be managed efficiently by monitoring power line distribution parameters at sensors 115/116 located at many power line communication devices 138, 139, 135 positioned throughout the communication and distribution system 104. Examples of maintenance that may be improved include recloser duty monitoring; reading voltages associated with specific capacitors, specific capacitor banks, and regulators; voltage imbalance detection may be performed; secondary neutral failures may be identified; and switching steps may be more effectively implemented during planned power outages.

Planning also may be managed more efficiently by monitoring power line distribution parameters at sensors 115/116 located at many power line communication devices 138, 139, 135 positioned throughout the communication and distribution system 104. Examples of planning processed that may be improved include; feeder flow planning (by power flow validation); quantification of cold load pickup; quantification of secondary losses; quantification of primary losses; application of manual switching devices; application of distribution automation devices; subsidiary relay settings; selection/validation of fuse sizes; recloser settings; capacitor switching sequencing; adaptive preferred/alternate switch schemes (semi-firm design); transformer unit/bank size requirements; and detection of current imbalances. The current sensor devices 116, voltage sensor devices and other parameter sensor devices 115 may be used to measure the parameters, and store the data in a database (e.g., of the power line server) for use in predicting conditions such as power distribution equipment failures. Thus, upon detecting a certain power distribution condition (e.g., a failure of a transformer, a fault, etc.), the values of the stored parameters just prior to the condition may be analyzed to identify a correlation (e.g., a pattern) between the parameter values and the condition so that when substantially the same parameter value measurements are detected again, the condition may be predicted (and notification transmitted).

As one embodiment, the data from parameter sensor devices, including the current sensor devices that measure LV or MV current, is communicated over a twisted pair (or alternately coaxial cable) by its local communication device to an upstream device. In this embodiment, the local communication device may include a LV power line interface (and modem for communicating with users) and communicate the user data over the twisted pair (or coaxial cable) as well. Thus, its local communication device may include an interface for communicating with parameter sensor device 115, a LV interface, a controller, and a network interface that includes a network modem for communicating over the twisted pair (or coaxial cable) to an upstream device. The network modem may be a DSL modem, cable modem, WiMAX modem, HomePlug compatible modem, or DS2 modem, and may employ any suitable protocol and/or modulation scheme including, but not limited to, OFDM, DOCSIS, WiMAX (IEEE 802.16), DSL, Ultra Wide Band (UWB), or other suitable modulation scheme or protocol. In another embodiment, some or all of the local communication devices may employ a wireless modem (forming part of its network interface) for wireless communications upstream such as an IEEE 802.11 a,b,g, or n modem, a WiMAX (IEEE 802.16) modem, or another suitable wireless modem.

FIG. 10 shows an example embodiment of a portion of a network having multiple power line distribution parameter sensor devices 162, including dual sensor assemblies 160*a-d* and other sensor devices 116. The dual sensor device assemblies 160 may include a pair of current sensor devices 115 that may be coupled together (e.g., mechanically) and may share a common communication interface for communication with a power line communication device (e.g., a backhaul device 138, an access device 139, or a repeater 135). In this example embodiment, the dual sensor device assembly 160 is coupled to the power line communication device 138, 139, 135 by a fiber optic conductor 174. In other embodiments of sensor devices 115, 116, 160, communications with the power line communication device may occur over a wireless communication path.

As shown in FIG. 10, the distribution transformer 112 is connected to the MV power line 110 via conductor 165 at a connection point 164. In this example, a first current sensor device 115*a* is disposed on a first side of the connection point 164 and a second current sensor device 115*b* is disposed on the second side of the connection point 164. As shown in the figure, the flow of current is from left to right over the MV power line 110. Thus, current sensor device 115*a* measures the current on the MV power line 110 before the connection point 164 associated with transformer 112. Current sensor device 115*b* measures the current on the MV power line 110 after the connection point 164 associated with transformer 112. By computing the difference measured between the two measured current sensor devices 115 (the current of device 115*a* minus the current of 115*b*), the PLC device 138, 139, 135 (assembly device 160) or other device (e.g., a remote computer) can determine the current carried through conductor 165 and drawn by the transformer 112. Various sub-networks 170*a-d* may be coupled to the medium voltage power line 110 and also include the same sensor device assemblies 160 and power line communication devices.

A power line distribution parameter sensor device 116 that measures current and voltage of the LV power line also may be located between the transformer 112 and customer premises on a LV power line connected to the transformer 112. For example a power line distribution parameter sensor device 116 may be located at the power meter for the premises, at the transformer 112 or somewhere along the low voltage power line 114. In the illustrated embodiment, the power line parameter sensor device 116 is coupled to, and located near, the power line communication device 138, 139, 135 and includes a voltage and current sensor device 117 measuring the voltage and current on both LV energized conductors (and current on the neutral).

By measuring current on the upstream and downstream side of the connection point 164, the current and/or power drawn by the transformer 112 can be determined by the power line communication device 138, 139, 135) and transmitted to a remote computer (e.g., over the MV power line, wirelessly, or via fiber optic) for use by the utility. Information of the current and/or power being drawn by the transformer 112 can be used initiate replacement of the transformer 112 (e.g., if the transformer load is approaching capacity) and/or for planning purposes. In addition, if the voltage of the MV power line 110 is known with sufficient accuracy or measured by a sensor device 116, the power input to, and output from, the transformer 112 can be calculated to thereby determine the efficiency of the transformer 112.

In some embodiments the dual sensor device assembly 160 may be packaged with (and installed together with) the conductor 165 at the connection point 164. For example, a conventional conductor 165 already in place may have its connector jumpered out to be replaced with a connector coupling to the dual sensor device assembly 160.

In some embodiments the dual sensor device assembly 160 may be self-powered, as discussed herein, by inductively drawing power from the medium voltage power line 110. Near the end of a medium voltage power line 110, the current may drop below a level needed to power the sensor assembly device 160*d*. In such case, however, the parameters measured by the immediately upstream dual sensor assembly 160*c* may be used to derive the load of the more downstream load 170*d*.

Figure 11:
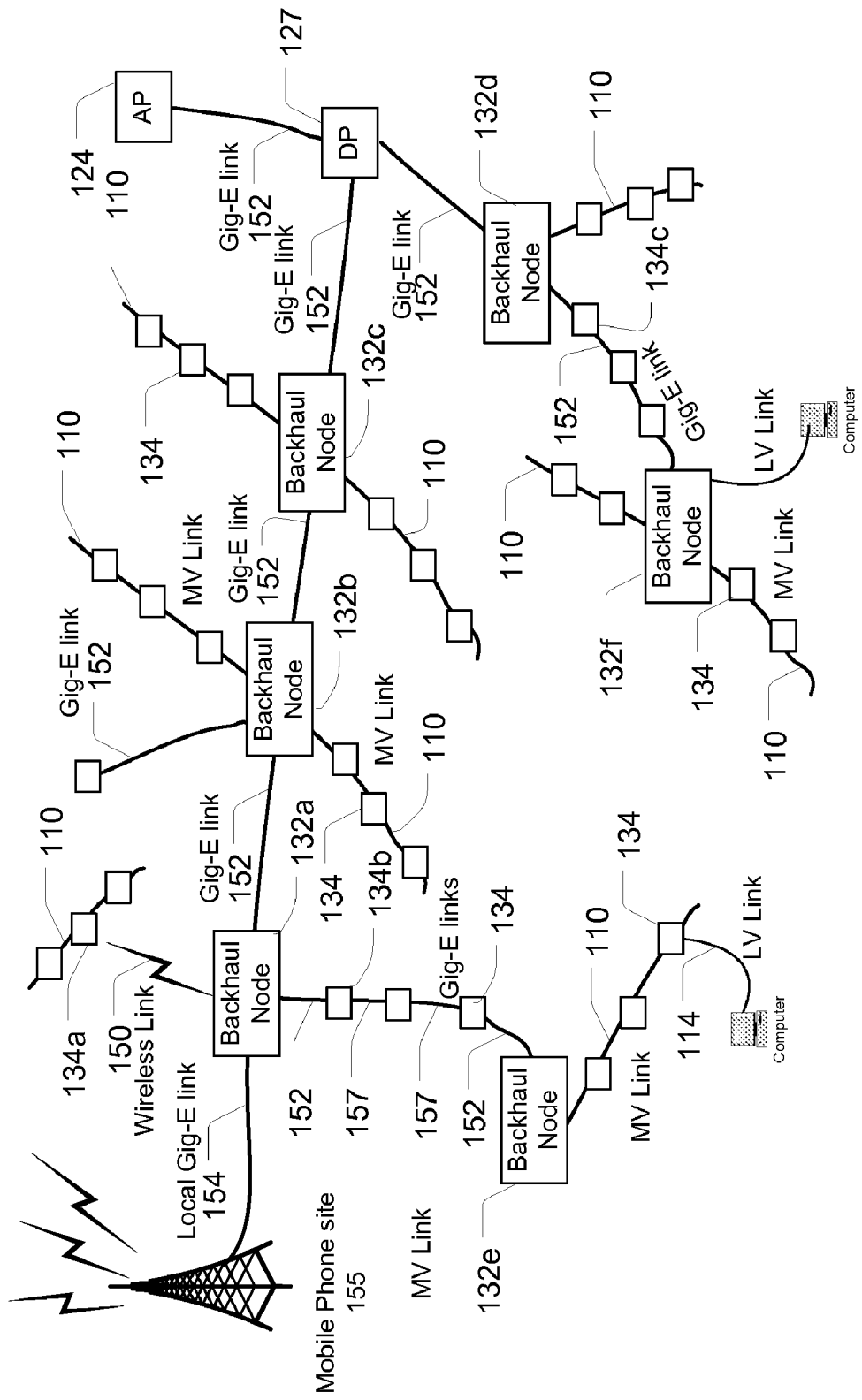
FIG. 11 is a partial network diagram showing an example topology of a power line communication and power distribution parameter system according to an example embodiment of the present invention.

Network Topology:

FIG. 11 shows an example embodiment of a network topology which illustrates many of the communication features of the backhaul node 132 and access node 134. For example, several backhaul nodes 132*a-c* may be coupled together in a daisy chain configuration by communication links 152. Such links 152 may be formed by the upstream and downstream ports of the gig-E switch 148 of the respective backhaul nodes 132. The gig-E switch 148 also may be implemented to connect a backhaul node 132*c* to a distribution point 127. Accordingly, the gig-E switch 148 may form part of a communication link along a path for communicating with an internet protocol network 126. Further, a local port of a gig-E switch 148 may be implemented to couple a backhaul node 132*a* to a mobile phone site 155 via link 154. The backhaul nodes 132*a-d* also may be coupled to MV power lines 110 to maintain MV links for communication with multiple access nodes 134 (shown as small rectangles). The backhaul node 132*a* may also be coupled to an access node 134*a* (which may repeat data for other access nodes 134) over a wireless communication link 150, for example, through the expansion port 146. The backhaul node 132*a* is further illustrated to couple to a chain of access devices 134 and a backhaul node 132*e*. The link from the backhaul node 132*a* to the access node 134*b* may be formed by coupling a downstream port of the gig-e switch 148 of backhaul node 132*a* to the gig-E port 156 of the access node 134*b*. A similar link is shown between the backhaul node 132*d* and the access node 134*c*. Still another communication link is shown over an LV power line 114 to couple an access node 134*d* to a computer and to couple a backhaul node 132*f* to computer via a LV power line 114.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A power line communication device for providing information related to a un-insulated medium voltage power line carrying power with a voltage greater than one thousand volts, comprising:
    a first current sensor device configured to be physically attached to the un-insulated medium voltage power line and to measure the current of the un-insulated medium voltage power line;
    said first current sensor device including a data interface, an analog-to-digital converter (ADC), and a memory;
    said first current sensor device including a processor in communication with said memory, said ADC and said data interface;
    wherein said processor is programmed to receive data representing the measured current carried by the un-insulated medium voltage power line;
    wherein said processor is programmed to store data of a plurality of current measurements in said memory;
    wherein said processor is programmed to retrieve the plurality of measurements from memory and to cause said data interface to transmit the data representing the plurality of measurements in a single transmission;
    a second device configured to be mounted to a utility pole and comprising:
        a sensor interface configured to communicate with said data interface of said first current sensor device;
        a modem configured to transmit data related to the measured current;
        a controller communicatively coupled to said modem and said sensor interface and having a memory with executable program code stored in said memory; and
        wherein said first current sensor device is electrically isolated from said second device.

2. The device of claim 1, wherein said first current sensor device includes a Rogowski coil that includes a first winding wound in a first direction and second winding wound in a second direction opposite to said first direction.

3. The device of claim 1, wherein said current sensor device includes a Rogowski coil that includes a first winding and a second winding comprising traces interwoven on a printed circuit board.

4. The device of claim 1, further comprising a voltage sensor device configured to measure a voltage of a power line and communicatively coupled to said controller.

5. The device of claim 4, wherein said controller is configured to determine a power factor based on data from said first current sensor device and said voltage sensor device.

6. The device of claim 1, further comprising a second current sensor device configured to measure the current carried by a low voltage power line.

7. The device of claim 1, wherein said modem is further configured to transmit power usage data received by said second device from an electric utility meter.

8. The device of claim 1, wherein said current sensor device and said second device are co-located at a utility pole.

9. The device of claim 8, wherein said current sensor device includes an isolated power source for supplying operating power to one or more components of said current sensor device.

10. The device of claim 9, wherein said power source is configured to inductively draw power from the medium voltage power line.

11. The device of claim 9, wherein said power source is configured to receive power for supplying the operating power via a fiber optic conductor.

12. The device of claim 9, wherein said power source is configured to derive power from solar energy.

13. The device of claim 1, wherein said current sensor device is configured to provide data to said second device via a wireless communication link.

14. The device of claim 13, wherein said current sensor device provides data to said second device via transmissions that include a duty cycle less than 0.1.

15. The device of claim 13, wherein said current sensor device provides data to said second device via transmissions that include a duty cycle less than 0.001.

16. The device of claim 13, wherein said current sensor device provides data to said second device via transmissions that include a duty cycle less than 0.00001.

17. The device of claim 1, wherein said data interface of said current sensor device includes a fiber optic transmitter.

18. The device of claim 1, wherein said data interface of said current sensor device includes a wireless transmitter.

19. The device of claim 1, wherein said
processor operates said first current sensor device in a reduced power state and in a second state that is not a reduced power state; and
wherein said processor responds to a first input from a timer by transitioning operation of said current sensor device from said reduced power state to said second state.

20. The device of claim 1, wherein said current sensor device further comprises:
a sensor;
an integrator circuit connected to said sensor; and
wherein said an analog-to-digital converter is directly connected to said integrator circuit.

21. A power line communication device for communicating over an un-insulated medium voltage power line carrying voltage greater than one thousand volts, comprising:
a parameter sensor device configured to be physically attached to the un-insulated medium voltage power line and to measure a parameter of the un-insulated medium voltage power line;
wherein said parameter sensor device comprises
a sensor;
an integrator circuit connected to said sensor; and
an analog-to-digital converter connected to said integrator circuit;
a modem configured to transmit data of the measured parameter;
a controller communicatively coupled to said sensor device and said modem;
said controller is programmed to receive data representing the measurement data from said analog-to-digital converter;
wherein said controller is programmed to store data of a plurality of measurements in a memory;
wherein said controller is programmed to retrieve the plurality of measurements from said memory and to cause said modem to transmit the data representing the plurality of measurements in a single transmission to a second device; and
wherein said parameter sensor device is electrically isolated from said the second device.

22. The device of claim 21, wherein said parameter sensor device includes a power supply configured to supply operating power to one or more components of said parameter sensor device and to receive power for supplying said operating power via a fiber optic conductor.

23. The device of claim 21, wherein said parameter sensor device is configured to provide data to said second device via a fiber optic conductor.

24. The device of claim 23, wherein said parameter sensor device includes a power supply configured to supply operating power to one or more components of said parameter sensor device and to receive power for supplying said operating power via a fiber optic conductor.

25. The device of claim 23, wherein said parameter sensor device includes a power supply configured to supply operating power to one or more components of said parameter sensor device and to inductively draw power from the medium voltage powerline.

26. The device of claim 21, wherein said parameter sensor device is configured to communicate with said second device via a wireless link.

27. The device of claim 26, wherein said parameter sensor device includes a power supply configured to supply operating power to one or more components of said parameter sensor device and to inductively draw power from the medium voltage powerline.

28. The device of claim 21, wherein said second device includes a second modem configured to receive power usage data from an electric utility meter.

29. The device of claim 21, wherein said parameter sensor device includes a Rogowski coil.

30. The device of claim 21, wherein said parameter sensor device includes a processor forming part of said controller and a timer;
wherein said processor operates said parameter sensor device in a reduced power state and in a second state that is not a reduced power state; and
wherein said processor responds to a first input from said timer by transitioning operation of said parameter sensor device from said reduced power state to said second state.

31. The device of claim 21, wherein said parameter sensor device includes an isolated power source.

32. The device of claim 21, wherein said parameter sensor device provides data to said second device via transmissions that include a duty cycle less than 0.1.

33. The device of claim 21, wherein said parameter sensor device includes a Rogowski coil that includes traces on a printed circuit board.

34. The system of claim 21, wherein a plurality of the power line communication devices are configured to measure the current at substantially the same time.

35. A method of determining electrical parameter data of a power distribution system that includes an uninsulated medium voltage power line, comprising:

operating a current sensor device in a reduced power state;
initiating a timer;
upon an expiration of said timer, operating said current sensor device in a second state that is not a reduced power state;
while operating said current sensor device in said second state, measuring the current of the un-insulated medium voltage power line with the current sensor device;
while operating said current sensor device in said second state, storing a plurality of current measurements in a memory;
while operating said current sensor device in said second state, transmitting data of the plurality current measurements stored in the memory in a single transmission to a communication device;
wherein the current sensor device is electrically isolated from the communication device; and
wirelessly transmitting data of the measured current with the communication device.

36. The method of claim 35, wherein said data of the measured current is provided to said communication device via a non-conductive communication link.

37. The method of claim 35, further comprising measuring the voltage of a power line.

38. The method of claim 37, further comprising determining a power factor of the power carried by the un-insulated medium voltage power line.

39. The method of claim 37, further comprising:
wirelessly transmitting data of the measured voltage with the communication device.

40. The method of claim 35, further comprising:
receiving power usage data from an electric utility meter with the communication device; and
wirelessly transmitting the power usage data to a remote device.

41. The method of claim 35, wherein said current sensor device and said communication device are co-located at a utility pole.

42. The method of claim 35, further comprising providing power to the current sensor device via an isolated power source.

43. The method of claim 35, wherein said current sensor device includes a Rogowski coil that includes a first winding wound in a first direction and second winding wound in a second direction; and
wherein said first winding and said second winding each include traces on a printed circuit board.

44. The method according to claim 35, wherein said transmitting data of the plurality current measurements to a communication device with the current sensor device comprises wirelessly transmitting the data.

45. A power line communication device, comprising:
a current sensor device configured to be physically attached to an un-insulated medium voltage power line and to measure the current of the un-insulated medium voltage power line;
wherein said current sensor device includes a first wireless transceiver;
a second device comprising:
a second wireless transceiver configured to communicate with said first wireless transceiver;
a voltage sensor configured to measure a voltage of a low voltage power line;
a modem configured to transmit data related of the measured current;
a controller communicatively coupled to said modem, said voltage sensor, and said second wireless transceiver and having a memory with executable program code stored in said memory;
wherein said program code includes a code segment executable to cause said controller to cause said modem to transmit data of the measured current received from said current sensor device and voltage data received from said voltage sensor;
wherein said current sensor device is electrically isolated from said second device;
wherein said current sensor device is configured to store data of a plurality of current measurements in a memory and, subsequent to storing data of the plurality of measurements, transmit data of the plurality of current measurements to said second device in a single transmission; and
wherein said current sensor device and said second device are co-located at a utility pole.

46. The device of claim 45, further comprising
a second wireless transceiver forming part of said second device and configured to communication with said first wireless transceiver; and
wherein said modem of said second device comprises a third wireless transceiver.

47. The device of claim 46, wherein said program code includes a code segment executable to cause said controller to determine a power factor of the power of the un-insulated medium voltage power line.

48. The device of claim 45, wherein said current sensor device transmits data to said second device via transmissions that have a duty cycle less than 0.1.

49. The device of claim 45, wherein said second device further comprises a second modem configured to receive power usage data from one or more electric utility meters.

50. The device of claim 49, wherein said
program code includes a code segment executable to cause said controller to cause said modem to transmit power usage data received from the one or more electric utility meters.

51. The device of claim 45, wherein said current sensor device includes a timer and a processor;
wherein said processor operates said current sensor device in a reduced power state and in a second state that is not a reduced power state; and
wherein said processor responds to a first input from said timer by transitioning operation of said current sensor device from said reduced power state to said second state.

52. The device method of claim 51, wherein said current sensor device includes an isolated power source.

53. The device of claim 51, wherein said current sensor device transmits data to said second device via transmissions that have a duty cycle less than 0.1.

54. The device of claim 45, wherein said current sensor device includes an analog to digital converter (ADC) and a memory coupled to said ADC.

55. The device of claim 45, wherein said current sensor device comprises:
a sensor;
an integrator circuit connected to said sensor; and
an analog-to-digital converter connected to said integrator circuit.

56. A power line communication device for providing information related to a medium voltage power line carrying power with a voltage greater than one thousand volts, comprising:

a first current sensor device configured to be physically attached to the medium voltage power line and to measure the current of the medium voltage power line;

said first current sensor device including an isolated power source for supplying operating power to one or more components of said current sensor device;

wherein said power source is configured to inductively draw power from the medium voltage power line;

said first current sensor including a first wireless modem;

a second device comprising:
  a second wireless modem configured to communicate with said first wireless modem;
  a third modem configured to transmit data related to the measured current;
  a controller communicatively coupled to said second wireless modem and said third modem and having a memory with executable program code stored in said memory;
wherein said first current sensor device and said second device are co-located at a utility pole; and
wherein said first current sensor device is configured to store data of a plurality of current measurements in a memory and, subsequent to storing data of the plurality of measurements, transmit data of the plurality of current measurements to said second device in a single transmission.

57. The device method according to claim 56, wherein said first current sensor device provides data to said second device via transmissions that having a duty cycle less than 0.1.

* * * * *

UNITED STATES PATENT AND TRADEMARK OFFICE
CERTIFICATE OF CORRECTION

PATENT NO. : 7,795,877 B2  
APPLICATION NO. : 11/555740  
DATED : September 14, 2010  
INVENTOR(S) : William O. Radtke et al.

Page 1 of 1

It is certified that error appears in the above-identified patent and that said Letters Patent is hereby corrected as shown below:

In column 4, line 35, delete "1 G," and insert -- 1G, --, therefor.

In column 17, line 9, delete "it" and insert -- its --, therefor.

In column 26, line 12, in claim 21, after "from" delete "said".

In column 27, line 13, in claim 35, before "current" insert -- of --.

In column 27, line 49, in claim 44, before "current" insert -- of --.

In column 28, line 49, in claim 52, after "device" delete "method".

In column 30, line 13, in claim 57, after "device" delete "method".

In column 30, line 15, in claim 57, delete "having" and insert -- have --, therefor.

Signed and Sealed this  
Fifth Day of April, 2011

David J. Kappos  
*Director of the United States Patent and Trademark Office*